(12) United States Patent
Colavolpe et al.

(10) Patent No.: US 10,116,476 B2
(45) Date of Patent: Oct. 30, 2018

(54) RECEIVING METHOD AND RECEIVER FOR SATELLITE-BASED AUTOMATIC IDENTIFICATION SYSTEMS

(71) Applicant: European Space Agency, Paris (FR)

(72) Inventors: Giulio Colavolpe, Parma (IT); Alessandro Ugolini, Fidenza (IT); Tommaso Foggi, Parma (IT); Juan Lizarraga Cubillos, Leiden (NL); Alberto Ginesi, Amsterdam (NL); Stefano Cioni, Hillegom (NL)

(73) Assignee: European Space Agency, Paris (FR)

( * ) Notice: Subject to any disclaimer, the term of this patent is extended or adjusted under 35 U.S.C. 154(b) by 0 days.

(21) Appl. No.: 15/110,928

(22) PCT Filed: Jan. 22, 2014

(86) PCT No.: PCT/EP2014/051273
§ 371 (c)(1),
(2) Date: Jul. 11, 2016

(87) PCT Pub. No.: WO2015/110155
PCT Pub. Date: Jul. 30, 2015

(65) Prior Publication Data
US 2016/0380792 A1     Dec. 29, 2016

(51) Int. Cl.
*H04L 27/22*     (2006.01)
*H04L 7/00*      (2006.01)
(Continued)

(52) U.S. Cl.
CPC ........ *H04L 27/2275* (2013.01); *H03M 13/09* (2013.01); *H03M 13/096* (2013.01);
(Continued)

(58) Field of Classification Search
CPC ...... H04L 1/0045; H04L 7/0029; H04L 7/007
See application file for complete search history.

(56) References Cited

U.S. PATENT DOCUMENTS

| | | | |
|---|---|---|---|
| 5,594,757 A | 1/1997 | Rohani | |
| 7,792,222 B2* | 9/2010 | Tang | H03M 13/45 |
| | | | 329/304 |

(Continued)

FOREIGN PATENT DOCUMENTS

| | | |
|---|---|---|
| EP | 1 819 058 A1 | 8/2007 |
| EP | 2 315 366 A1 | 4/2011 |

(Continued)

OTHER PUBLICATIONS

Carl Nassar, Telecommunications Demystified, 2001, LLH Publishing, Section 5.4.1, p. 146.*

(Continued)

*Primary Examiner* — Ross Varndell
(74) *Attorney, Agent, or Firm* — Seed Intellectual Property Law Group LLP

(57) ABSTRACT

A method for demodulating a received signal relating to a sequence of transmitted symbols that have been modulated by continuous phase modulation includes normalizing samples of a sequence of samples generated from the received signal, to obtain a normalized sequence of samples, wherein an amplitude of each sample of the normalized sequence of samples has an absolute value equal to unity; estimating, on the basis of the normalized sequence of samples, a time offset and a frequency offset of the received signal, and using the estimated time offset and the estimated frequency offset for compensating the normalized sequence of samples for the time and frequency offsets, to obtain a compensated sequence of samples; and determining a sequence of symbols corresponding to the transmitted sequence of symbols on the basis of the compensated sequence of samples. Also disclosed is a receiver for demodulating a received signal relating to a sequence of (Continued)

transmitted symbols that have been modulated by continuous phase modulation.

22 Claims, 19 Drawing Sheets

(51) Int. Cl.
*H04L 27/227* (2006.01)
*H04L 27/233* (2006.01)
*H04L 1/00* (2006.01)
*H03M 13/09* (2006.01)
*H03M 13/15* (2006.01)
*H04B 7/185* (2006.01)
*H04L 27/00* (2006.01)

(52) U.S. Cl.
CPC .... *H03M 13/1575* (2013.01); *H04B 7/18513* (2013.01); *H04L 1/0045* (2013.01); *H04L 1/0052* (2013.01); *H04L 1/0061* (2013.01); *H04L 7/007* (2013.01); *H04L 7/0029* (2013.01); *H04L 27/0014* (2013.01); *H04L 27/2332* (2013.01); *H04L 2027/0028* (2013.01)

(56) References Cited

U.S. PATENT DOCUMENTS

| | | | |
|---|---|---|---|
| 8,204,507 B2* | 6/2012 | Yu | H04W 72/08 455/450 |
| 2007/0192667 A1* | 8/2007 | Nieto | H03M 13/45 714/780 |
| 2009/0193320 A1* | 7/2009 | Furbeck | H04L 1/0045 714/786 |
| 2011/0246483 A1* | 10/2011 | Darr | G06Q 10/10 707/748 |
| 2012/0263163 A1* | 10/2012 | Burzigotti | H04B 7/18515 370/344 |

FOREIGN PATENT DOCUMENTS

| | | |
|---|---|---|
| JP | 2000-59448 A | 2/2000 |
| JP | 2001-94474 A | 4/2001 |
| JP | 2001-230677 A | 8/2001 |
| JP | 2006-109019 A | 4/2006 |
| WO | 2006/122291 A2 | 11/2006 |
| WO | 2008/053853 A2 | 4/2009 |

OTHER PUBLICATIONS

Trandem, O., "Implementation of a Modem for Digital Phase Modulation Using Viterbi Decoding", IEEE proceedings of the Global Telecommunications Conference and Exhibition, vol. 3, Dec. 1, 1986, p. 1869-1873.
Morelli, M. et al., "Joint Frequency and Timing Recovery for MSK-Type Modulation", IEEE Transactions on Communications, vol. 47, No. 6, Jun. 1, 1999, p. 938-946.
Colavolpe, G. et al., "Noncoherent Sequence Detection of Continuous Phase Modulations", IEEE Transactions on Communications, vol. 47, No. 9, Sep. 1, 1999, p. 1303-1307.
Chandran, P. et al., "Symbol Timing Recovery for CPM with Correlated Data Symbols", IEEE Transactions on Communications, vol. 57, No. 5, May 1, 2009, p. 1265-1270.
Seshadri, R. et al., "Bandwidth Constrained, Low Complexity Noncoherent CPM With ML Soft-Decision Differential Phase Detection", Military Communications Conference, Oct. 17-20, 2005, p. 1-6.
Burzigotti, P. et al., "Advanced Receiver Design for Satellite-Based AIS Signal Detection", 2010 5th Advanced Satellite Multimedia Systems Conference and the 11th Signal Processing for Space Communications Workshop, Sep. 13, 2010, p. 1-8.
International Search Report and Written Opinion for PCT/EP2014/051273 dated Sep. 15, 2014, 25 pgs.
Japanese Office Action, dated Nov. 29, 2017, for Japanese Application No. 2016-547850, 6 pages (with English Translation).
Makimoto et al., "Examinations for realization OFDM symbol extract using data decimation," *Proceedings of the IEICE General Conference 2004*, IEICE, 2004, p. 122 (with English machine translation).

* cited by examiner

RECEIVING METHOD AND RECEIVER FOR SATELLITE-BASED AUTOMATIC IDENTIFICATION SYSTEMS

BACKGROUND

Technical Field

The present disclosure relates to a method for demodulating a received signal relating to a sequence of transmitted symbols that have been modulated by continuous phase modulation (CPM) and to an apparatus (receiver) for demodulating a received signal relating to a sequence of transmitted symbols that have been modulated by CPM.

The disclosure is particularly, though not exclusively, applicable to demodulating a received signal relating to a sequence of transmitted symbols that represent one or more messages in an Automatic Identification System (AIS). Embodiments of the disclosure are particularly suited to be applied to an AIS receiver in a spacecraft, such as a satellite.

Description of the Related Art

An AIS provides identification and location information to naval vessels and shore stations with the aim of exchanging data including information on position, identification, course and speed. This allows naval vessels to anticipate and thus avoid collisions with other naval vessels by means of continuous traffic monitoring with several navigation aids. In addition, AIS also offers important naval vessel monitoring services to coastal guards or to search and rescue organizations.

The AIS is based on broadcasting of fixed-length digital messages in a Time Division Multiple Access (TDMA) framework. Individual AIS messages corresponding to sequences of symbols to be transmitted are modulated by means of CPM. Each naval vessel equipped with an AIS apparatus broadcasts information (data) in small slots of 26.67 ms. In each of these slots a message of 256 bits is transmitted at a rate of 9600 b/s using a binary Gaussian Minimum Shift Keying (GMSK) modulation over two Very High Frequency (VHF) carriers. Nearby AIS emitters synchronize with each other in order to avoid packet collisions, i.e., avoid emission of more than one packet in the same time slot by different emitters (time slots are defined globally on the basis of a common temporal reference provided by GPS). As a result, Self-Organized Time Division Multiple Access (SOTDMA) regions are formed. Each SOTDMA region (SOTDMA cell) is designed to cope with path delays not longer than 12 bits, which translates into a maximum range of about 200 nautical miles, but typically the radio frequency coverage is limited to about 40 nautical miles. Within this range all the naval vessels in visibility transmit in accordance with the SOTDMA protocol which ensures that packet collisions between bursts transmitted by different naval vessels are prevented.

Attempts to improve handling of hazardous cargo, security and countering illegal operations have led to the introduction of satellite based AIS. Satellite based AIS enables detecting and tracking naval vessels at distances from coastlines that are larger than can be accomplished by normal terrestrial VHF communications, so that naval vessels may be detected at very long distanced from shores. In particular, a LEO (low earth orbit) constellation of small-size satellites, with an altitude ranging from 600 km to 1000 km, can provide global coverage. Each satellite is provided with an on-board small VHF antenna with a field of view spanning over a few thousands of nautical miles and thus comprising up to several hundreds of SOTDMA cells.

Satellite-based AIS, however, has to face with additional technical challenges that were not considered in the original AIS standard: AIS messages from naval vessels belonging to different SOTDMA cells are not synchronized and therefore can collide with each other, satellite motion with respect to the emitters induces a significant Doppler shift of the carrier frequency, the signal to noise ratio is lower than in terrestrial AIS, and the relative propagation channel delay among the population of naval vessels in visibility at any given time is much higher than for terrestrial AIS.

These problems have been addressed in patent document EP 2 315 366 A1 which relates to a receiver architecture for satellite-based AIS systems. This receiver architecture is composed of three zonal demodulators that process different (but overlapping) frequency bandwidths, as is shown in FIG. 1. The frequency band of each of the AIS channels is sub-divided into three sub-bands, and each of the sub-bands is processed by a corresponding one of the zonal demodulators, thereby exploiting the carrier Doppler diversity for obtaining an estimate of the distance to the respective transmitter and the corresponding path delay. Interference resilient message synchronization is performed by means of Cyclic Redundancy Check (CRC)-aided techniques. Multiple colliding messages are detected by means of digital re-modulation and cancellation of successfully decoded messages.

However, the above solution to the problems faced by satellite-based AIS turns out to be in need of improvement as regards packet error rate (PER) and bit error rate (BER), especially in the presence of heavy traffic leading to heavy interference between AIS messages received at the AIS receiver, and in the presence of AIS messages containing long sequence of zeros. The latter typically occur for latitudes and/or longitudes of the transmitting naval vessel close to zero degrees, i.e., close to the equator and/or the zero median, e.g., in the gulf of Guinea.

BRIEF SUMMARY

Embodiments of the present disclosure are designed to address the limitations of the prior art discussed above. Embodiments of the disclosure improve the performance of a receiver in a satellite-based AIS system as regards PER and BER in the presence of interference. Further, embodiments of the disclosure improve the performance of a receiver in a satellite-based AIS system as regards PER and BER for longitudes and altitudes close to zero degrees.

In at least one embodiment, disclosed herein is a method for demodulating a received signal relating to a sequence of transmitted symbols that have been modulated by continuous phase modulation and a receiver for demodulating a received signal relating to a sequence of transmitted symbols that have been modulated by continuous phase modulation, having the features of the respective independent claims. Preferred embodiments of the disclosure are described in the dependent claims.

According to an aspect of the present disclosure, a method for demodulating a received signal relating to a sequence of transmitted symbols that have been modulated by continuous phase modulation comprises the steps of: normalizing the sequence of samples generated from the received signal, to obtain a normalized sequence of samples, wherein an amplitude of each sample of the normalized sequence of samples has an absolute value (i.e., magnitude) equal to unity; estimating, on the basis of the normalized sequence of samples, a time offset and a frequency offset of the received signal, and using the estimated time offset and the estimated frequency offset for compensating the normalized sequence of samples for the time and frequency offsets, to obtain a compensated sequence of samples; and determining a sequence of symbols corresponding to the transmitted sequence of symbols on the basis of the compensated sequence of samples. The method may further comprise a step of generating the sequence of samples from the received signal.

The above method may be applied to each zonal demodulator of the prior art AIS receiver disclosed in EP 2 315 366 A1. As the present inventors have found out, introducing the step of normalizing the samples to unity results in a significant increase of performance as regards PER and BER in the presence of heavy traffic (i.e., in the presence of strong interference). Contrary to intuition, the introduction of this additional step in demodulating the signal results in an overall improvement of performance and efficiency. Any decrease of performance in the absence of the above aggravating circumstances is more than balanced by the significant increase in performance in the presence of these circumstances. Moreover, limiting the samples to unit absolute value reduces the overall computational burden for subsequent processing steps, which results in an overall increase of processing efficiency and/or gives leeway for implementing more effective, even if slightly less efficient processes at the pre-detection stage, the detection stage, and/or the post-processing stage of the AIS receiver.

Preferably, the estimate of the time offset and the estimate of the frequency offset are determined using a feed-forward algorithm that involves performing an auto-correlation of a sequence of samples input to the algorithm. Further preferably, estimating the time offset and the frequency offset involves: filtering the normalized sequence of samples using a low-pass filter to obtain a filtered sequence of samples; determining the estimate of the time offset on the basis of a first result obtained by auto-correlating the filtered sequence of samples; determining the estimate of the frequency offset on the basis of a second result obtained by auto-correlating the filtered sequence of samples or a first sequence of samples derived from the normalized sequence of samples; interpolating the normalized sequence of samples or a second sequence of samples derived from the normalized sequence of samples on the basis of the estimate of the time offset, in order to correct for the time offset; and compensating the normalized sequence of samples or a third sequence of samples derived from the normalized sequence of samples for the frequency offset using the estimate of the frequency offset, to obtain the compensated sequence of samples.

By this measure, reliable and accurate estimates of the time offset and frequency offset can be determined, and the received signal, or the sequence of samples derived therefrom can be compensated for the effect of the time offset and the frequency offset of the received signal. Therein, the time offset corresponds to an offset of first bits of respective packets of the received signal with respect to a fixed time frame of the receiver (e.g., a time frame provided by GPS), and the frequency offset corresponds to an offset between the actual frequency of the received signal from the respective carrier frequency at which the signal had been transmitted (in the satellite-based AIS the frequency offset is due to a Doppler shift). After compensation, the sequence of samples can be subjected to packet detection (packet decoding), the reliability of which is enhanced by having access to the determined reliable and accurate estimates of the time offset and the frequency offset. Here, the more accurate the estimates of the time offset and the frequency offset, the lower the resulting BER (and correspondingly, also PER).

A particular advantage is achieved if estimating the time offset and the frequency offset involves: filtering the normalized sequence of samples using a first low-pass filter to obtain a first filtered sequence of samples; determining the estimate of the time offset on the basis of a first result obtained by auto-correlating the first filtered sequence of samples; determining a first estimate of the frequency offset on the basis of the first result; and compensating the normalized sequence of samples for the frequency offset using the first estimate of the frequency offset, to obtain a first compensated sequence of samples. Determination of the first estimate of the frequency offset may be further based on the estimate of the time offset. Preferably, estimating the time offset and the frequency offset further involves: filtering the first compensated sequence of samples using a second low-pass filter to obtain a second filtered sequence of samples; determining a second estimate of the frequency offset on the basis of a second result obtained by auto-correlating the second filtered sequence of samples; compensating the first compensated sequence of samples for the frequency offset using the second estimate of the frequency offset, to obtain a second compensated sequence of samples; and interpolating the second compensated sequence of samples on the basis of the estimate of the time offset to obtain the compensated sequence of samples. Determination of the second estimate of the frequency offset may be further based on the estimate of the time offset.

Accordingly, the pre-detection synchronization stage (i.e., the stage responsible for estimating the time offset and the frequency offset and performing appropriate compensation of the signal or sequence of samples) according to the application comprises two stages of frequency offset estimation. The second stage of frequency offset estimation operates on a sequence of samples compensated for the effect of the frequency offset on the basis of a first estimate determined by the first stage of frequency offset estimation and thus can provide a more accurate estimate of the frequency offset. Therein, applying the first and second stages of frequency offset estimation is particularly efficient since said stages are applied to the normalized sequence of samples which comprises only samples having an absolute value of unity. Especially in filtering and auto-correlating, a significant enhancement in performance is achieved by the normalization. As it turns out, the inventive combination of providing a step of normalizing the sequence of samples and a step of estimating the frequency offset in a two-stage process is advantageous both with regard to overall performance and accuracy of the resulting estimate of frequency estimation. In this regard, the method disclosed herein has been found to be particularly efficient in avoiding a biased frequency estimate.

Alternatively, estimating the time offset and the frequency offset may involve: filtering the normalized sequence of samples using a first low-pass filter to obtain a first filtered sequence of samples; determining the estimate of the time offset on the basis of a first result obtained by auto-correlating the first filtered sequence of samples; and interpolating the normalized sequence of samples on the basis of the estimate of the time offset to obtain an interpolated sequence of samples. Estimating the time offset and the frequency offset may further involve: filtering the interpolated sequence of samples using a second low-pass filter to obtain a second filtered sequence of samples; down-sampling the second filtered sequence of samples to obtain a first down-sampled sequence of samples; determining a first estimate of the frequency offset on the basis of a second result obtained by auto-correlating the first down-sampled sequence of samples; and compensating the interpolated sequence of samples for the frequency offset using the first estimate of the frequency offset, to obtain a first compensated sequence of samples. Determination of the first estimate of the frequency offset may be further based on the estimate of the time offset.

In addition to the above, estimating the time offset and the frequency offset may further involve: filtering the first compensated sequence of samples using a third low-pass filter to obtain a third filtered sequence of samples; determining a second estimate of the frequency offset on the basis of a third result obtained by auto-correlating the third filtered sequence of samples; and compensating the first compensated sequence of samples for the frequency offset using the second estimate of the frequency offset, to obtain the compensated sequence of samples. Determination of the second estimate of the frequency offset may be further based on the estimate of the time offset. The first result may be obtained by applying a first auto-correlation algorithm to the first filtered sequence of samples, and the second result may be obtained by applying the first auto-correlation algorithm to the down-sampled sequence of samples. As a preferred alternative, the first result is obtained by applying a first auto-correlation algorithm to the first filtered sequence of samples, and the second result is obtained by applying a second auto-correlation algorithm that is different from the first auto-correlation algorithm to the first down-sampled sequence of samples. Preferably, the third result is obtained by applying the first auto-correlation algorithm to the third filtered sequence of samples.

According to the present disclosure, either the same auto-correlation algorithm can be employed as the first and second auto-correlation algorithms, or different algorithms can be employed. A particular advantage however has been found to result from employing different algorithms. Accordingly, e.g., a first coarse (and time-efficient) estimation of the frequency offset can be performed using a first algorithm, and a fine estimation of the frequency offset can be determined subsequently. As the inventors have found out, the decrease in overall accuracy of the estimate of the frequency offset compared to a case with two stages of fine estimation of the frequency offset is minimal, while this measure significantly increases the performance and efficiency both with regard to time and computational effort and reduces the overall complexity of the corresponding receiver for demodulating the received signal.

As an alternative, in the above the first result may be obtained by applying a first auto-correlation algorithm to the first filtered sequence of samples, the second result may be obtained by applying a second auto-correlation algorithm that is different from the first auto-correlation algorithm to the down-sampled sequence of samples, and the first compensated sequence of samples may be the compensated sequence of samples.

By appropriate choice of the second auto-correlation algorithm, a very fast estimation of the frequency offset can be obtained, if needs be.

A particular advantage is achieved if in the step of determining the sequence of symbols, each of the determined symbols is a symbol that has a highest probability of being identical to the corresponding transmitted symbol.

According to another aspect of the disclosure, a method for demodulating a received signal relating to a sequence of transmitted symbols that have been modulated by continuous phase modulation comprises the steps of: estimating a time offset and a frequency offset of the received signal on the basis of a sequence of samples generated from the received signal, and using the estimated time offset and the estimated frequency offset for compensating the sequence of samples for the time and frequency offsets, to obtain a compensated sequence of samples; and determining a sequence of symbols corresponding to the transmitted sequence of symbols on the basis of the compensated sequence of samples, wherein each of the determined symbols is a symbol that has a highest probability of being identical to the corresponding transmitted symbol. The method may further comprise a step of generating the sequence of samples from the received signal.

Accordingly, the method disclosed herein employs a Soft Input Soft Output (SISO) algorithm in the detection stage. Instead of outputting a sequence of bits (symbols) that has, as a whole, the highest probability of corresponding to the transmitted sequence, as is done in the prior art, now a determination based on a probability (likelihood) is performed separately for each symbol. This is especially advantageous in case of interference between packets, which in the prior art may result in incorrectly decoded packets. By contrast, according to the present disclosure, if a decoded packet or sequence of samples turns out to be incorrect, post-processing techniques considering individual symbols or pairs of symbols may be applied in order to obtain the correct packet or sequence. Clearly, such post-processing techniques are not possible in the prior art, in which the decoded packet or sequence is treated as a whole.

It is further suggested that for each determined symbol, a probability of the determined symbol being identical to the corresponding transmitted symbol is determined.

As indicated above, having knowledge of probabilities (likelihoods) of individual symbols being correct enables application of very efficient post-processing techniques for correcting incorrectly decoded packets. For instance, if only few symbols of a packet are wrong, as is usually the case, the wrong symbols can be identified by referring to the individual probabilities and identifying those symbols that have the lowest probabilities. Accordingly, wrong symbols can possibly be corrected, thereby obtaining a correctly decoded packet in an efficient manner.

A further advantage is achieved if the method further comprises: generating a packet from the determined sequence of symbols, calculating a checksum for the packet, and if the checksum indicates that the packet has not been decoded correctly, inverting a pair of symbols in the packet, wherein the two symbols of the pair of symbols are separated by a further symbol.

Having at hand the probabilities (likelihoods) of the symbols of a decoded packet, those symbols in an incorrectly decoded packet that are most likely wrong can be determined. By changing (inverting) the values of these symbols, then possibly a correct packet or sequence can be obtained. As the inventors have realized, errors in the decoded packet almost always occur in couples (pairs) of symbols that are separated by a further symbol, i.e., in pairs of the form "p1|x|p2", where "p1" and "p2" are the symbols of the pair, that are not necessarily identical, and "x" indicates a further symbol separating the symbols of the pair. Then, by simultaneously inverting the symbols of such pair, possibly a correct packet can be obtained.

Preferably, the method further comprises: in the packet that has been judged as not decoded correctly, determining a first pair of symbols having the lowest probability of being identical to the corresponding transmitted symbols, and inverting the symbols of the determined first pair of symbols. As a further preferred alternative, the method further comprises: in the packet that has been judged as not decoded correctly, determining a first pair of symbols having the lowest probability of being identical to the corresponding transmitted symbols and a second pair of symbols having the next-to-lowest probability of being identical to the corresponding transmitted symbols, and inverting, not necessarily in this order, the symbols of the first pair only, the symbols of the second pair only, and the symbols of the first and second pairs simultaneously, until the checksum of the resulting packet indicates that the resulting packet has been decoded correctly. As a yet further preferred alternative, the method comprises: for the packet that has been judged as not decoded correctly, determining an error sequence on the basis of the checksum and a pre-stored table indicating a relationship between checksum values and error sequences, and inverting pairs of symbols that are located in the packet at positions indicated by the error sequence.

Typically, only few (i.e., one or two) pairs of symbols per packet are incorrect, so that the above method allows arriving at correctly decoded packets in a very efficient manner. As the inventors have further found out, the checksum of an incorrect packet is indicative of an error pattern, which indicates the location of the incorrect pair(s) of symbols. By inverting the pair(s) of symbols indicated by the error sequence, efficiency of post-processing can be further increased.

In the presently-disclosed method, the sequence of samples may have a first ratio of samples per transmitted symbol, and the method may further comprise: down-sampling the compensated sequence of samples to obtain a down-sampled sequence of samples, the down-sampled sequence of samples having a second ratio of samples per transmitted symbol lower than the first ratio of samples, and determining the sequence of symbols corresponding to the transmitted sequence of symbols on the basis of the down-sampled sequence of samples. Preferably, the first ratio is 3 or more, and the second ratio is 1.

By this measure, efficiency of the decoding stage can be enhanced, while at the same time accuracy of the estimation of both the time offset and the frequency offset is increased. Using fewer samples per symbols for determining the sequence of symbols corresponding to the transmitted sequence of symbols reduces complexity of the method and the corresponding receiver, while still optimal detection can be performed.

It is further suggested that the method further comprises: identifying packets of symbols that have been decoded correctly, cancelling said correctly decoded packets from the sequence of symbols by subtracting, from the sequence of symbols, a reconstructed sequence of symbols that has been reconstructed from said correctly decoded packets to obtain an interference-cancelled sequence of symbols, and repeating the aforementioned steps for the interference-cancelled sequence of symbols.

For a satellite-based AIS, messages from individual transmitters arrive at the receiver out of synchronization with an internal time frame of the receiver (provided, e.g., by GPS), and may moreover overlap (i.e., interfere) with each other. However, in case that one or more packets for a given time interval have been successfully decoded, these packets may be subtracted from the received signal or the sequence of samples generated therefrom in the given time interval. Thereby, interference by these successfully decoded packets is cancelled from the received signal or the sequence of samples generated therefrom, and further packets, the decoding of which had failed previously due to interference (or decoding of which has not been attempted), may now be decoded. Thus, this measure increases the ratio of successfully decoded packets in case of interference between packets of different transmitters, which especially occurs in the case of satellite-based AIS.

An additional advantage is achieved if the method further comprises, if decoding a packet of symbols has failed, determining a reception timing at which the respective packet has been received, determining the field of view from which signals could have been received at the reception timing, obtaining a list of potential transmitters that have been in the field of view at the reception timing, correlating, for each of the potential transmitters, an identifier of the respective potential transmitter of the packet for which decoding has failed with said packet to obtain a correlation value, obtaining previously obtained data relating to each of the potential transmitters for which the correlation value is above a predetermined threshold, and decoding the packet using the previously obtained data.

Typically, packets that are found to be decoded incorrectly, and that also cannot be corrected using post-processing techniques, are discarded. However, these packets can possibly be decoded when taking into account available a-priori information. While typical receivers do not possess sufficient computational resources for performing so-called data-aided decoding, incorrect packets may be transmitted to a remote site having sufficient computational resources, such as an on-ground site. Using available a-priori information that can be derived from or corresponds to previously obtained information, a reliability of packet decoding, i.e., a chance that a given packet is decoded correctly, can be increased. In the case of the AIS, a-priori information is available in the form of the Maritime Mobile Service Identifiers (MMSIs) of naval vessels that are included in a respective field of AIS messages, as well as in the form of expected positions of the naval vessels.

According to another aspect of the present disclosure, a receiver for demodulating a received signal relating to a sequence of transmitted symbols that have been modulated by continuous phase modulation comprises: normalization means for normalizing samples of a sequence of samples generated from the received signal, to obtain a normalized sequence of samples, wherein an amplitude of each sample of the normalized sequence of samples has an absolute value equal to unity; estimation means for estimating, on the basis of the normalized sequence of samples, a time offset and a frequency offset of the received signal, and using the estimated time offset and the estimated frequency offset for compensating the normalized sequence of samples for the time and frequency offsets, to obtain a compensated sequence of samples; and decoding means for determining a sequence of symbols corresponding to the transmitted sequence of symbols on the basis of the compensated sequence of samples. The receiver may further comprise sampling means for generating the sequence of samples on the basis of the received signal.

A particular advantage is achieved if the estimation means comprises: a first low-pass filter for filtering the normalized sequence of samples to obtain a first filtered sequence of samples; time offset estimation means for determining the estimate of the time offset on the basis of a first result obtained by auto-correlating the first filtered sequence of samples; first frequency offset estimation means for determining a first estimate of the frequency offset on the basis of the first result; and first compensation means for compensating the normalized sequence of samples for the frequency offset using the first estimate of the frequency offset, to obtain a first compensated sequence of samples. The first frequency offset estimation means may be configured to determine the first estimate of the frequency offset further on the basis of the estimate of the time offset. Preferably, the estimation means further comprises: a second low-pass filter for filtering the first compensated sequence of samples to obtain a second filtered sequence of samples; second frequency offset estimation means for determining a second estimate of the frequency offset on the basis of a second result obtained by auto-correlating the second filtered sequence of samples; second compensation means for compensating the first compensated sequence of samples for the frequency offset using the second estimate of the frequency offset, to obtain a second compensated sequence of samples; and interpolation means for interpolating the second compensated sequence of samples on the basis of the estimate of the time offset to obtain the compensated sequence of samples. The second frequency offset estimation means may be configured to determine the second estimate of the frequency offset further on the basis of the estimate of the time offset.

Alternatively, the estimation means may comprise: a first low-pass filter for filtering the normalized sequence of samples to obtain a first filtered sequence of samples; time offset estimation means for determining the estimate of the time offset on the basis of a first result obtained by auto-correlating the first filtered sequence of samples; and interpolation means for interpolating the normalized sequence of samples on the basis of the estimate of the time offset to obtain an interpolated sequence of samples. The estimation means may further comprise: a second low-pass filter for filtering the interpolated sequence of samples to obtain a second filtered sequence of samples; down-sampling means for down-sampling the second filtered sequence of samples to obtain a first down-sampled sequence of samples; first frequency offset estimation means for determining a first estimate of the frequency offset on the basis of a second result obtained by auto-correlating the first down-sampled sequence of samples; and first compensation means for compensating the interpolated sequence of samples for the frequency offset using the first estimate of the frequency offset, to obtain a first compensated sequence of samples. The first frequency offset estimation means may be configured to determine the first estimate of the frequency offset further on the basis of the estimate of the time offset.

In addition to the above, the estimation means may further comprise: a third low-pass filter for filtering the first compensated sequence of samples to obtain a third filtered sequence of samples; second frequency offset estimation means for determining a second estimate of the frequency offset on the basis of a third result obtained by auto-correlating the third filtered sequence of samples; and second compensation means for compensating the first compensated sequence of samples for the frequency offset using the second estimate of the frequency offset, to obtain the compensated sequence of samples. The second frequency offset estimation means may be configured to determine the second estimate of the frequency offset further on the basis of the estimate of the time offset.

Preferably, the decoding means is configured to determine the sequence of symbols such that each of the determined symbols is a symbol that has a highest probability of being identical to the corresponding transmitted symbol.

According to yet another aspect of the present disclosure, a receiver for demodulating a received signal relating to a sequence of transmitted symbols that have been modulated by continuous phase modulation comprises: estimation means for estimating, on the basis of a sequence of samples generated from the received signal, a time offset and a frequency offset of the received signal, and using the estimated time offset and the estimated frequency offset for compensating the sequence of samples for the time and frequency offsets, to obtain a compensated sequence of samples; and decoding means for determining a sequence of symbols corresponding to the transmitted sequence of symbols on the basis of the compensated sequence of samples, wherein each of the determined symbols is a symbol that has a highest probability of being identical to the corresponding transmitted symbol. The receiver may further comprise sampling means for generating the sequence of samples from the received signal.

Preferably, the decoding means is further configured to determine, for each determined symbol, a probability of the determined symbol being identical to the corresponding transmitted symbol.

It is also of advantage if the receiver further comprises: packet generating means for generating a packet from the determined sequence of symbols, checksum calculating means for calculating a checksum for the packet, and inverting means for inverting, if the checksum indicates that the packet has not been decoded correctly, a pair of symbols in the packet, wherein the two symbols of the pair of symbols are separated by a further symbol.

Preferably, the receiver further comprises means for determining a first pair of symbols having the lowest probability of being identical to the corresponding transmitted symbols in the packet that has been judged as not decoded correctly, wherein the inverting means is further configured to invert the symbols of the determined first pair of symbols. Alternatively, the receiver may comprise means for determining a first pair of symbols having the lowest probability of being identical to the corresponding transmitted symbols and a second pair of symbols having the next-to-lowest probability of being identical to the corresponding transmitted symbols in the packet that has been judged as not decoded correctly, wherein the inverting means is configured to invert, not necessarily in this order, the symbols of the first pair only, the symbols of the second pair only, and the symbols of the first and second pairs simultaneously, until the checksum of the resulting packet indicates that the resulting packet has been decoded correctly. As a further alternative, the receiver may comprise means for determining, for the packet that has been judged as not decoded correctly, an error sequence on the basis of the checksum and a pre-stored table indicating a relationship between checksum values and error sequences, wherein the inverting means is further configured for inverting pairs of symbols that are located in the packet at positions indicated by the error sequence.

The present application further suggests that the sequence of samples has a first ratio of samples per transmitted symbol, the receiver further comprises down-sampling means for down-sampling the compensated sequence of samples to obtain a down-sampled sequence of samples, the down-sampled sequence of samples having a second ratio of samples per transmitted symbol lower than the first ratio of samples, and the decoding means is configured to determine the sequence of symbols corresponding to the transmitted sequence of symbols on the basis of the down-sampled sequence of samples. Preferably, the first ratio is 3 or more, and the second ratio is 1.

The receiver may further comprise: means for identifying packets of symbols which have been decoded correctly, and cancellation means for cancelling said correctly decoded packets from the sequence of samples generated from the received signal by subtracting, from the sequence of samples, a reconstructed signal that has been reconstructed from said correctly decoded packets to obtain an interference-cancelled sequence of samples to be used for further demodulation processing.

DETAILED DESCRIPTION

Figure 1:
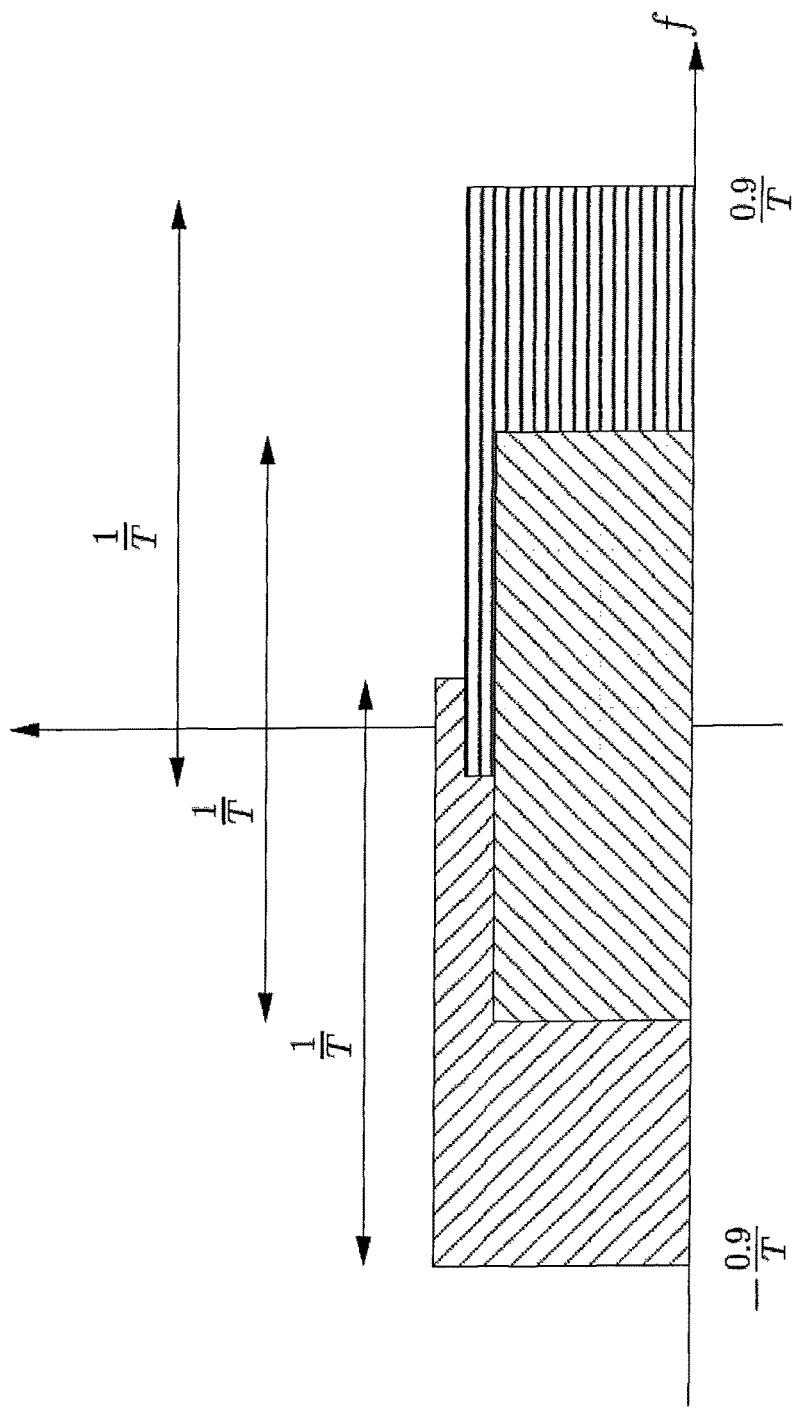
FIG. 1 illustrates the partition of an AIS channel into three overlapping sub-bands according to the prior art.

Preferred embodiments of the present disclosure will be described in the following with reference to the accompanying figures, wherein in the figures identical objects are indicated by identical reference numbers. It is understood that the present invention shall not be limited to the described embodiments, and that the described features and aspects of the embodiments may be modified or combined to form further embodiments of the present disclosure.

The present disclosure relates to a method for demodulating a received signal relating to a sequence of transmitted symbols that have been modulated by continuous phase modulation and to a receiver for demodulating a received signal relating to a sequence of transmitted symbols that have been modulated by continuous phase modulation. In various embodiments, the method disclosed herein is advantageously adopted to each zonal demodulator of the prior art receiver known from EP 2 315 366 A1.

Signal Model and Notation

First, as a foundation of the detailed description that will be presented below, the underlying signal model and notation will be presented.

Following J. B. Anderson, T. Aulin, and C.-E.W. Sundberg, Digital Phase Modulation, New York: Plenum Press, 1986 (Anderson et al.), the complex envelope of a CPM signal can be written as $$s(t, \alpha) = \sqrt{\frac{2E_S}{T}} \exp\left\{j2\pi h \sum_{n=0}^{N-1} \alpha_n \, q(t-nT)\right\}, \quad \text{(eq. 1.1)}$$

where $E_S$ is the energy per information symbol, T is the symbol interval, h is the modulation index, N is the number of transmitted information symbols, $\alpha = \{a_n\}_{n=0}^{N-1}$ is the information sequence, and q(t) is the phase pulse, constrained to be such that $$q(t) = \begin{cases} 0, & t \leq 0 \\ \frac{1}{2}, & t \geq LT \end{cases} \quad \text{(eq. 1.2)}$$

L being the correlation length. Several examples of commonly used phase pulses are reported in Anderson et al.

The modulation index is usually written as h=r/p (where r and p are relatively prime integers), and the information symbols belong to the M-ary alphabet $\{\pm 1, \pm 3, \ldots, \pm(M-1)\}$, M being a power of two. For this case, it has been shown in B. E. Rimoldi, A decomposition approach to CPM, IEEE Trans. Inform. Theory, vol. 34, pp. 260-270, March 1988 (Rimoldi) that the CPM signal in the generic time interval [nT, (n+1)T] is completely defined by the symbol $\alpha_n$, the correlative state $\omega_n$ and the phase state $\phi_n$. Therein, the correlative state $\omega_n$ is given by $$\omega_n = (\alpha_{n-1}, \alpha_{n-2}, \ldots, \alpha_{n-L+1}), \quad \text{(eq. 1.3)}$$

and the phase state $\phi_n$ can be recursively defined as $$\phi_n = [\phi_{n-1} + \pi h \alpha_{n-L}]_{2\pi}, \quad \text{(eq. 1.4)}$$

where $[\cdot]_{2\pi}$ denotes the "modulo $2\pi$" operator. In other words, we may express the complex envelope of a CPM signal as $$s(t, \alpha) = \sqrt{\frac{2E_S}{T}} \sum_{n=0}^{N-1} s_T(t - nT; \alpha_n, \omega_n) e^{j\phi_n}, \quad \text{(eq. 1.5)}$$

(Rimoldi decomposition) where $S_T(t-nT; \alpha_n, \omega_n)$ is a slice of signal of length T (with support in [nT, (n+1)T]) whose shape only depends on symbol $\alpha_n$ and correlative state $\omega_n$ and is independent of the considered symbol interval. For the initialization of recursion in (eq. 1.4), the following conventions are adopted:

$$\phi_0 = 0, \quad \text{(eq. 1.6)}$$

$$\alpha_n = 0 \; \forall n < 0 \quad \text{(eq. 1.7)}$$

At any given time epoch n, the correlative state $\omega_n$ can assume $M^{L-1}$ different values, while the phase state $\phi_n$ can assume p different values, so that the CPM signal can be described by means of a finite-state machine with $pM^{L-1}$ possible values of the state $\sigma_n = (\omega_n, \phi_n)$. When n is even, the p values assumed by the phase state $\phi_n$ belong to the alphabet $\mathcal{A}_e = \{2\pi hm, m=0, 1, \ldots, p-1\}$, while, when n is odd, belong to the alphabet $\mathcal{A}_o = \{2\pi h, m+\pi h, m=0, 1, \ldots, p-1\}$ (when r is even, $\mathcal{A}_o$ and $\mathcal{A}_e$ coincide). In the following, the integer representation for the phase state and information symbols $$\alpha_n = 2\overline{\alpha}_n - (M-1), \quad \text{(eq. 1.8)}$$

$$\phi_n = -\pi h(M-1)n + 2\pi \overline{\phi}_n \quad \text{(eq. 1.9)}$$

will be adopted, so that $\overline{\alpha}_n \in \{0, 1, \ldots, M-1\}$ and $\overline{\phi}_n \in \{0, 1, \ldots, p-1\}$. The integer $\overline{\phi}_n$ can be recursively updated according to $$\overline{\phi}_n = [\overline{\phi}_{n-1} + \overline{\alpha}_n]_p \quad \text{(eq. 1.10)}$$

Following U. Mengali and M. Morelli, Decomposition of M-ary CPM signals into PAM waveforms, IEEE Trans. Inform. Theory, vol. 41, pp. 1265-1275, September 1995 (Mengali et al. 1995), the complex envelope of a CPM signal (eq. 1.1) may be exactly expressed as $$s(t, \alpha) = \sum_{k=0}^{F-1} \sum_{n} \alpha_{k,n} p_k(t - nT), \quad \text{(eq. 1.11)}$$

based on a Laurent decomposition, where $F=(M-1)2^{(L-1)\log_2 M}$ is the number of linearly modulated pulses $\{p_k(t)\}$, and $\{\alpha_{k,n}\}$ are the so-called pseudo-symbols (hereafter, simply referred to as symbols). The expressions of pulses $\{p_k(t)\}$ and those of symbols $\{\alpha_{k,n}\}$ as a function of the modulation parameters and of the information symbols $\{\alpha_n\}$ can be found in Mengali et al. 1995. By truncating the summation in (eq. 1.11) to the first K<F terms, the approximation $$s(t, \alpha) \simeq \sum_{k=0}^{K-1} \sum_{n} \alpha_{k,n} p_k(t - nT) \quad \text{(eq. 1.12)}$$

is obtained.

Most of the signal power is concentrated in the first M−1 components, i.e., those associated with the pulses $\{p_k(t)\}$ with $0 \leq k \leq M-2$, which are denoted as principal components. As a consequence, a value of K=M−1 may be used in (eq. 1.12) to attain a very good tradeoff between approximation quality and number of signal components. A nice feature of the principal components is that their symbols $\{\alpha_{k,n}\}_{k=0}^{M-2}$ can be expressed as a function of $a_n$ and $a_{0,n-1}$ only.

The GMSK modulation format described in K. Murota, K. Hirade, GMSK modulation for digital mobile radio telephony, IEEE Trans. Commun., vol. 29, pp. 1044-1050, July 1981 (Murota et al.) is a binary CPM (hence M=2, $\alpha_n \in \{\pm 1\}$, and $E_S = E_b$, where $E_b$ is the energy per information bit) with modulation index h=1/2 and phase pulse mathematically described in Murota et al. The derivative of this phase pulse can be obtained by filtering a rectangular pulse of length T with a Gaussian filter of proper −3 dB bandwidth B. In the case of AIS, the value of B normalized to the symbol rate is BT=0.4÷0.5. For an illustration of the phase pulse for the case of a unitary-amplitude GMSK signal, it is referred to Murota et al. Although in this case the correlation length is in principle unlimited, L=2÷3 can be assumed, wherein simulations conducted by the inventors show that there is no appreciable difference between the cases of L=3 and L=2. Preferably, L=3 is chosen in the context of the present disclosure.

Considering now the Laurent representation of a GMSK signal, in this case there is only M 1=1 principal component and (eq. 1.12) turns into $$s(t, \alpha) = \sum_{n} \alpha_{0,n} p_0(t - nT). \quad \text{(eq. 1.13)}$$

To simplify the notation, the definitions $$\alpha_n = \alpha_{0,n}$$

$$p(t) = p_0(t).$$

will be used in the following.

The principal pulse p(t) is calculated according to Mengali et al. 1995, further according to which symbol $\alpha_n$ can be recursively computed as $$\alpha_n = j\alpha_n \alpha_{n-1} \quad \text{(eq. 1.14)}$$

and is related to the phase state $\phi_n$ via $$\alpha_{n-1} = e^{j\phi_n}.$$

After this brief introduction of the underlying signal model and notation relating thereto, now the implementation, architecture and operation of an embodiment of a digital receiver will be described.

Receiver Architecture

Although in the following, for convenience in the mathematical derivations, it will mostly be assumed that a continuous-time signal is available, a digital implementation of the receiver is required. A possible way of extracting a sufficient statistic from the received signal is by means of a technique disclosed in H. Meyr, M. Oerder, A. Polydoros, On sampling rate, analog prefiltering, and sufficient statistics for digital receivers, IEEE Trans. Commun., vol. 42, pp. 3208-3214, December 1994.

It will be further assumed that the useful signal component in the received signal is band-limited (although this is not strictly true in the case of CPM signals, whose spectrum has an infinite support) with bandwidth lower than η/2T, where η is a proper integer. The complex envelope of the received signal is pre-filtered using an analog low-pass filter which leaves unmodified the useful signal and has a vestigial symmetry around η/2T. A sufficient statistic can be obtained by extracting η samples per symbol interval from the signal after the analog pre-filter and, in addition, the condition on the vestigial symmetry of the analog pre-filter ensures that the noise samples are independent and identically distributed complex Gaussian random variables with mean zero and variance $2N_O\eta/T$, $2N_O$ being the power spectral density (PSD) of the noise complex envelope.

Considering a reasonable power spectral density of the GMSK signal and the maximum frequency uncertainty that can be tolerated, $\eta=3$ samples per bit interval are sufficient and, without loss of generality, will be considered in the following.

Figure 2:
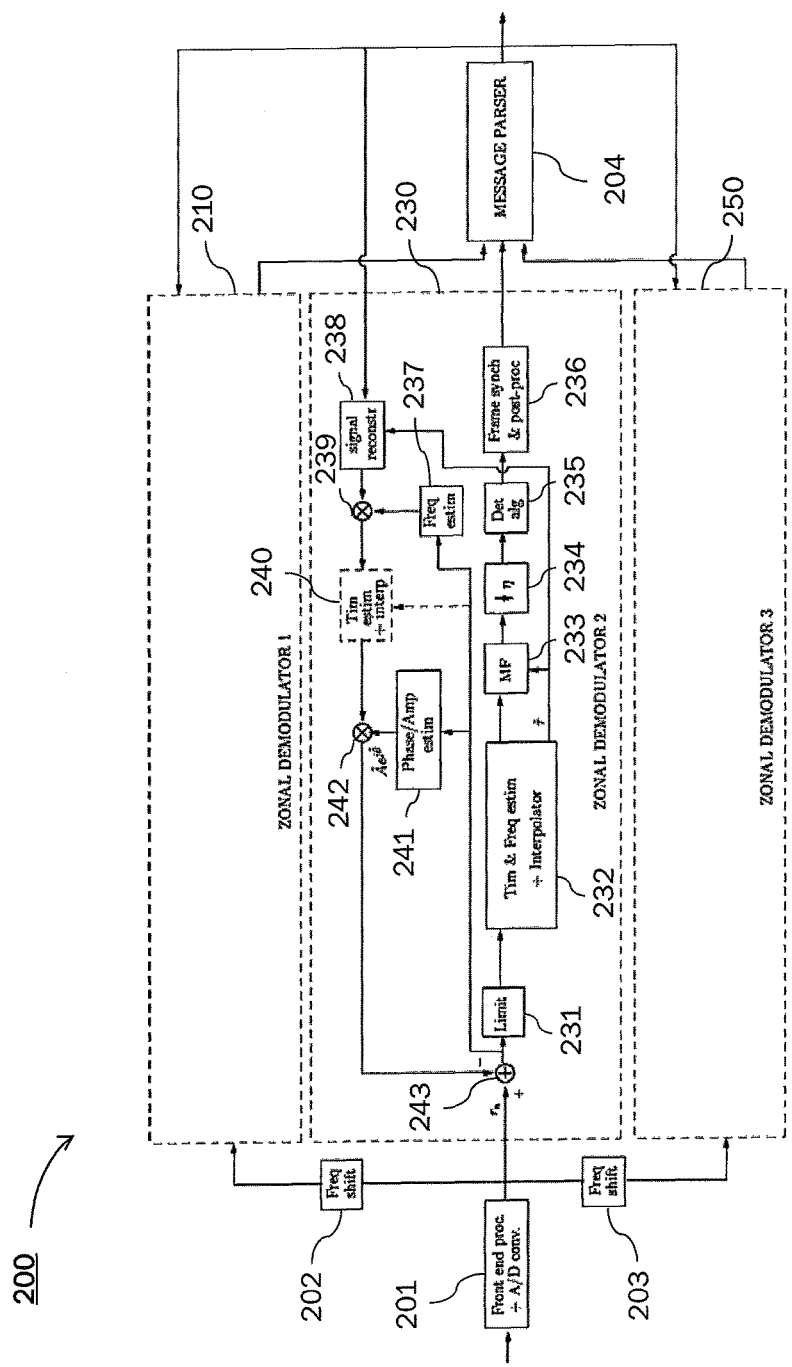
FIG. 2 is a schematic representation of a receiver according to an embodiment of the present disclosure.

An implementation of a digital receiver 200 according to the present disclosure will now be described with reference to FIG. 2. With this example, the overall architecture of the receiver 200 corresponds to that of the prior art receiver disclosed in EP 2 315 366 A1, wherein however the zonal demodulators 210, 230, 250 of the receiver 200 are different from those of the prior art receiver.

The signal received from a VHF antenna is first processed by a front end unit 201 (sampling means) comprising an analog front end and an A/D converter. The resulting discrete-time signal (i.e., sequence of samples) is properly shifted in frequency by frequency shifting means 202, 203 for each of three zonal demodulators 210, 230, 250 and each resulting signal is sent to the respective zonal demodulator. Alternatively, instead of a parallel implementation, the same zonal demodulator can be reused to reduce the hardware complexity. In this case however, obviously, the latency will increase. Output signals of the three zonal demodulators 210, 230, 250 are brought together in a message parser 204 for obtaining and outputting the demodulated AIS messages.

As indicated above, in order to exploit the frequency diversity resulting from the Doppler spread, the receiver 200 consists of three zonal demodulators 210, 230, 250, each of which is specifically designed to process only one slice of the AIS channel and to achieve the target performance within that slice. Since the estimation range of the frequency estimator 232 is slightly less than $$\pm\frac{0.21}{T},$$

and taking into account that due to a maximum Doppler shift of ±4 kHz and a maximum frequency uncertainty of transmit and receive oscillators of ±1.8 kHz, the maximum value of the frequency uncertainty is $$\pm 5.8 \text{ kHz} = \pm\frac{0.604}{T},$$

it is suggested to center the zonal demodulators at the nominal frequency, at the nominal frequency $$+\frac{0.4}{T}$$

and at the nominal $$-\frac{0.4}{T},$$

respectively. This slicing of the AIS channel is illustrated in FIG. 1. Nevertheless, while the three zonal demodulators 210, 230, 250 are configured to demodulate signals of different frequencies, their underlying architecture is very similar.

Each of the three zonal demodulators 210, 230, 250 included in the receiver 200 is composed of three main sub-blocks that are properly interconnected. By way of example, in the following, the architecture of the zonal demodulator 230 that is fed with the un-shifted signal will be described. The zonal demodulator 230 comprises a pre-detection synchronization unit 231, 232, a matched filter 233, 234 (down-sampling means), a detection unit 235 (decoding means), and a post-detection synchronization unit 237-243.

The pre-detection synchronization unit performs a preliminary estimation of all channel parameters that need to be compensated before detection. The accuracy of these estimates must be higher than the sensitivity of the detection algorithm to an uncompensated error. The pre-detection synchronization unit comprises a limiter 231 normalization means) and a timing and frequency estimator 232 (estimation means). The limiter 231 is applied to the sequence of received samples $r_n$ (complex valued samples) and limits the magnitude of each of the complex samples to unity. In other words, the limiter 231 generates a sequence of normalized samples $r_n'$ defined by $r_n'=r_n/|r_n|$, that is the limiter 231 generates a sequence of normalized samples $r_n'$ by dividing each sample $r_n$ by its respective absolute magnitude $|r_n|$.

The sequence of normalized samples is fed to the timing and frequency estimator 232 which estimates a time offset (timing offset) and a frequency offset of the received signal. Therein, the time offset is an offset relative to a given time frame and corresponds to an offset of first bits of respective packets of the received signal with respect to the given time frame (e.g., a time frame of the receiver provided by GPS), and the frequency offset is an offset relative to a given frequency and corresponds to an offset between the frequency of the received signal with respect to the respective carrier frequency of the AIS. For satellite-based AIS, the frequency offset is due to a Doppler shift. The timing and frequency estimator 232 works on a window of $L_O$ symbols and uses $\eta=3$ samples per symbol. The estimates of the time offset and the frequency offset are used to compensate (correct) the normalized sequence of samples for said offsets, i.e., to compensate for the impact of these offsets by shifting the normalized sequence of samples in time and in frequency. As a result, the timing and frequency estimator 232 outputs an estimate $\hat{\tau}$ of the time offset and a compensated (corrected) sequence of samples. More details on the pre-detection synchronization unit will be provided below.

After frequency and timing estimation and compensation in the timing and frequency estimator 232, the received signal is filtered using the matched filter (oversampled filter) 233, 234 which is matched to the principal pulse of the Laurent decomposition. One sample per symbol interval is retained at the output of the matched filter 233, 234 which uses the information on the estimate $\hat{\tau}$ of the time offset provided by the timing and frequency estimator 232 in the process of down-sampling. The sequence of samples output by the matched filter 233, 234 (down-sampled sequence of samples) is fed to the detection unit 235.

The detection unit 235 detects (decodes) packets corresponding to the sequence of samples input thereto. More details on the detection unit 235 and its operation will be provided below.

The post-detection synchronization unit performs a fine estimation of the channel parameters needed for the reconstruction and cancellation of the detected signal (i.e., the detected packets). In general, the estimation accuracy must be greater than that of the pre-detection synchronization unit. The post-detection synchronization unit comprises a frequency estimator 237, a signal reconstructor 238, a first compensator 239, a quadratic interpolator 240, a phase and amplitude estimator 241, a second compensator 242, and a subtractor 243.

In the frequency estimator 237, a more refined estimate of the frequency offset is determined. The signal reconstruction unit 238 is in practice a discrete-time CPM modulator followed by the quadratic interpolator 240 that, taking into account the timing estimate performed in the pre-detection stage, tries to align the reconstructed signal and the received samples. Since the discrete-time CPM modulator 238 has to produce three samples for each couple ($\alpha_n$, $\phi_n$) (the correlative state is absent in the case of GMSK and the phase state $\phi_n$ takes on two values), it can be conveniently implemented through a look-up table. In the first compensator 239, the reconstructed signal is compensated for an effect of the frequency offset of the received signal on the basis of the more refined estimate of the frequency offset before input to the quadratic interpolator 240. In the phase and amplitude estimator 241, a phase and an overall amplitude of the received signal is determined, and the output of the quadratic interpolator 240 is compensated in the second compensator 242 for phase and amplitude of the received signal as determined by the phase and amplitude estimator 241 (i.e., so as to match the phase and amplitude of the received signal).

The output of the second compensator 242 is input to the subtractor 243 in which the processed reconstructed signal (i.e., the reconstructed sequence of samples) is subtracted from the received signal (i.e., the sequence of samples derived therefrom), in order to cancel correctly decoded packets from the received signal, thereby cancelling interference by these packets. More details on the post-detection synchronization unit will be provided below.

Lastly, frame synchronization is performed by computing the CRC for the 128 possible positions of the start of a message. When the right position is found, the CRC is verified, the search is stopped and the successfully decoded message is passed on to the message parser block 204, which has the functions of discarding duplicated messages and passing the successfully detected messages to the signal reconstructor of each zonal demodulator 210, 230, 250.

Figure 3:
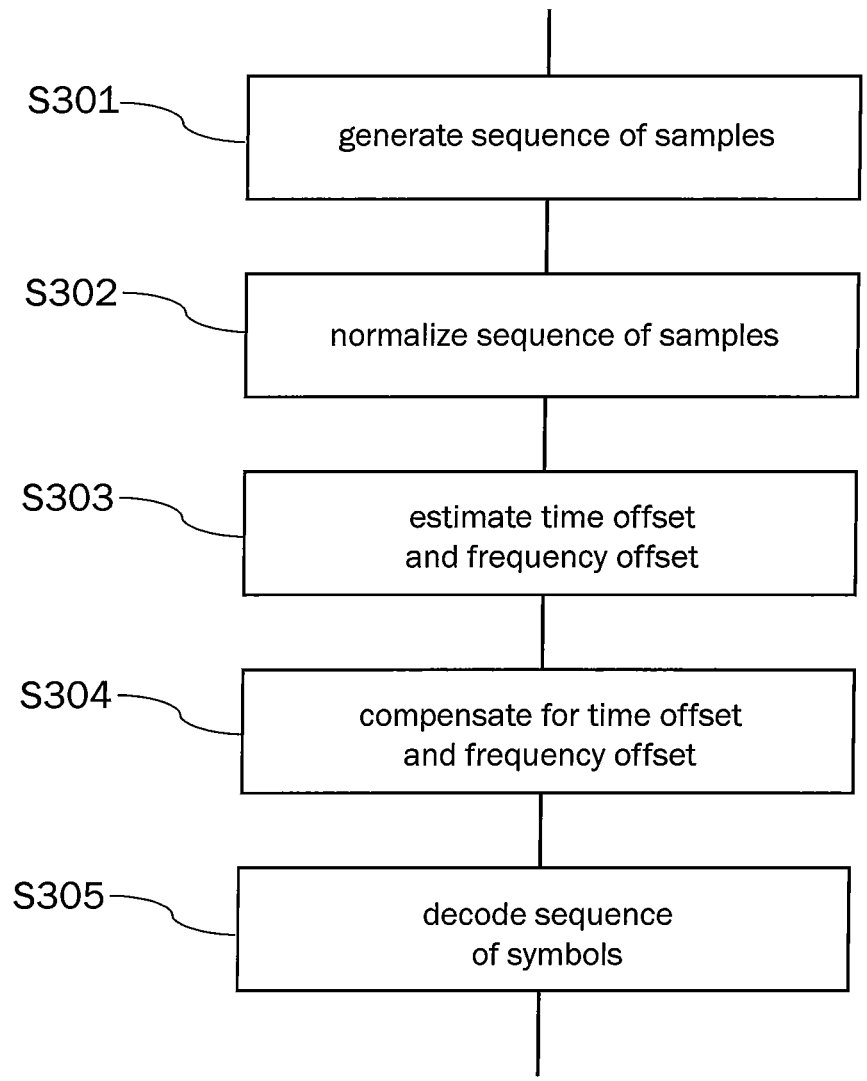
FIG. 3 is a flow chart illustrating a process flow for demodulating a received signal according to an embodiment of present disclosure.

Next, operation of the receiver 200, i.e., a procedure for demodulating a received signal relating to a sequence of transmitted symbols that have been modulated by continuous phase modulation, will be described with reference to the flow chart of FIG. 3.

At step S301, a sequence of samples $r_n$ is generated from the received signal. This step is performed at the front end unit 201, which in this sense acts as sampling means.

At step S302, the samples $r_n$ of the sequence of samples are normalized, thereby obtaining a normalized sequence of samples $r_n'$. After normalization, the amplitude of each sample of the normalized sequence of samples has an absolute value equal to unity, i.e., $|r_n'|=1$ or $r_n'=e^{jX_n}$. The normalized samples $r_n'$ are obtained via $r_n'=r_n/|r_n|$. This step is performed in the limiter 231, which in this sense acts as normalization means.

At step S303, a time offset and a frequency offset of the received signal are estimated on the basis of the normalized sequence of samples. Further, at step S304, the estimated time offset and estimated frequency offset are used for compensating (correcting) the normalized sequence of samples for time and frequency offsets, thereby obtaining a compensated sequence of samples. Both steps S303 and S304 are performed in the timing and frequency estimator 232, which in this respect act as an estimation means.

At step S305, a sequence of symbols corresponding to the transmitted sequence of symbols is determined on the basis of the compensated sequence of samples. This step is performed in the detection unit 235, which in this sense acts as demodulation means.

In the following, the operation in the above three units and in the principal components of the receiver 200 will be described in more detail.

Pre-Detection Stage

First, the pre-detection synchronization unit and its operation will be described. The aim of this first synchronization stage is to estimate, in a non-data-aided (NDA) mode (data-aided solutions do not seem to be viable because of the very low number of known symbols in the transmitted sequence), and compensate for the frequency offset F and the timing offset $\tau$ that affect the received signal.

The complex envelope r(t) of the received signal can be modeled by $$r(t)=As(t-\tau,\alpha)\exp\{j\theta\}\exp\{j2\pi Ft\}+w(t), \qquad \text{(eq. 3.1)}$$

where a constant amplitude A, a constant phase offset $\theta$, and an additive white Gaussian noise (AWGN) process w(t) modeling the noise complex envelope are also accounted for. It is to be noted that any interfering users are not included in (eq. 3.1), since the interference can be neglected in the present stage of the receiver design. On the other hand, the impact of the interferers on the receiver performance can be evaluated using extensive computer simulations. It is further pointed out that the pre-detection synchronization stage does not attempt to recover the phase offset $\theta$ of the received signal, since the detection unit 235 described below can tolerate the presence of this offset.

As has been found by the inventors, in the presence of interference a performance improvement of the receiver can be obtained when samples $r_n$, after cancellation of the previously detected signal, are normalized to unit amplitude. This normalization is performed by the limiter 231 which is applied to the received samples. The advantage of such a transformation in the presence of interference is found to be much higher than the performance degradation that might result in the absence of interference.

In the context of the present disclosure, four different alternative implementations for the timing and frequency estimator 232 which is comprised by the pre-detection synchronization unit are proposed. The alternative implementations are found to have similar performance—unless a long sequence of zeros is present in the data field, producing a large bias in the performance of some of them—but have different complexity. For three of these implementations, two instances of frequency estimation are required to avoid a bias problem of the frequency estimation that would reduce the estimation range, while a second instance of the frequency estimation is not necessary for one of the implementations.

According to all four implementations, the estimate of the time offset and the estimate of the frequency offset are determined using a feed-forward algorithm that involves performing an auto-correlation of a sequence of samples input to the algorithm. In this algorithm, the normalized sequence of samples output by the limiter 231 is filtered using a low-pass filter to obtain a filtered sequence of samples, the estimate of the time offset is determined on the basis of a first result obtained by auto-correlating the filtered sequence of samples, and the estimate of the frequency offset is determined on the basis of a second result obtained by auto-correlating the filtered sequence of samples or a first sequence of samples derived from the normalized sequence of samples. Then, the normalized sequence of samples or a second sequence of samples derived from the normalized sequence of samples is interpolated on the basis of the estimate of the time offset, and the normalized sequence of samples or a third sequence of samples derived from the normalized sequence of samples is compensated for the frequency offset using the estimate of the frequency offset, to obtain the compensated sequence of samples. Determination of the estimate of the frequency offset may be further based on the estimate of the time offset.

Next, the four implementations 400, 600, 800, 1000 of the timing and frequency estimator 232 and their respective operations will be described in more detail with reference to FIGS. 4 to 10.

Figure 4:
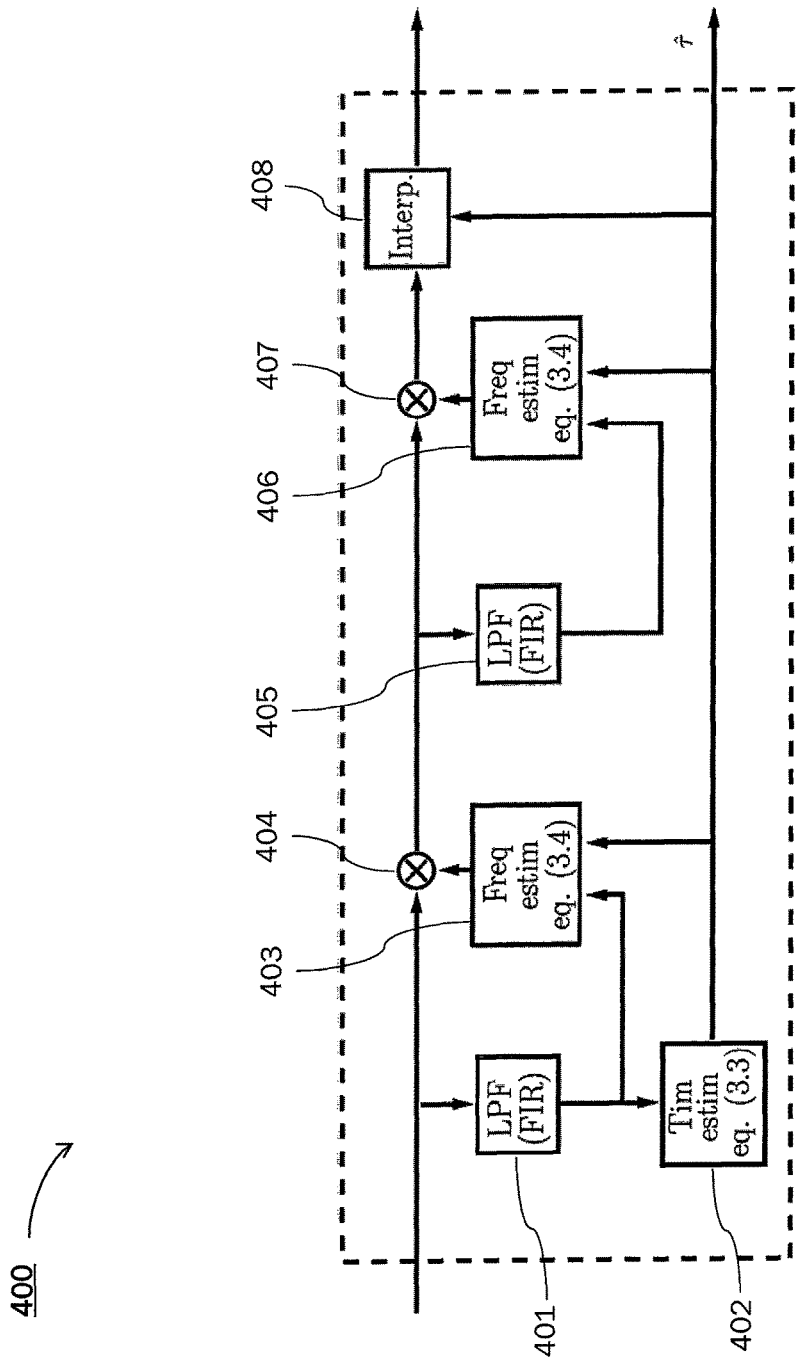
FIG. 4 is a schematic representation of a time and frequency estimator in the receiver of FIG. 2 for estimating a time offset and a frequency offset of the received signal according to an embodiment of present disclosure.
Figure 5:
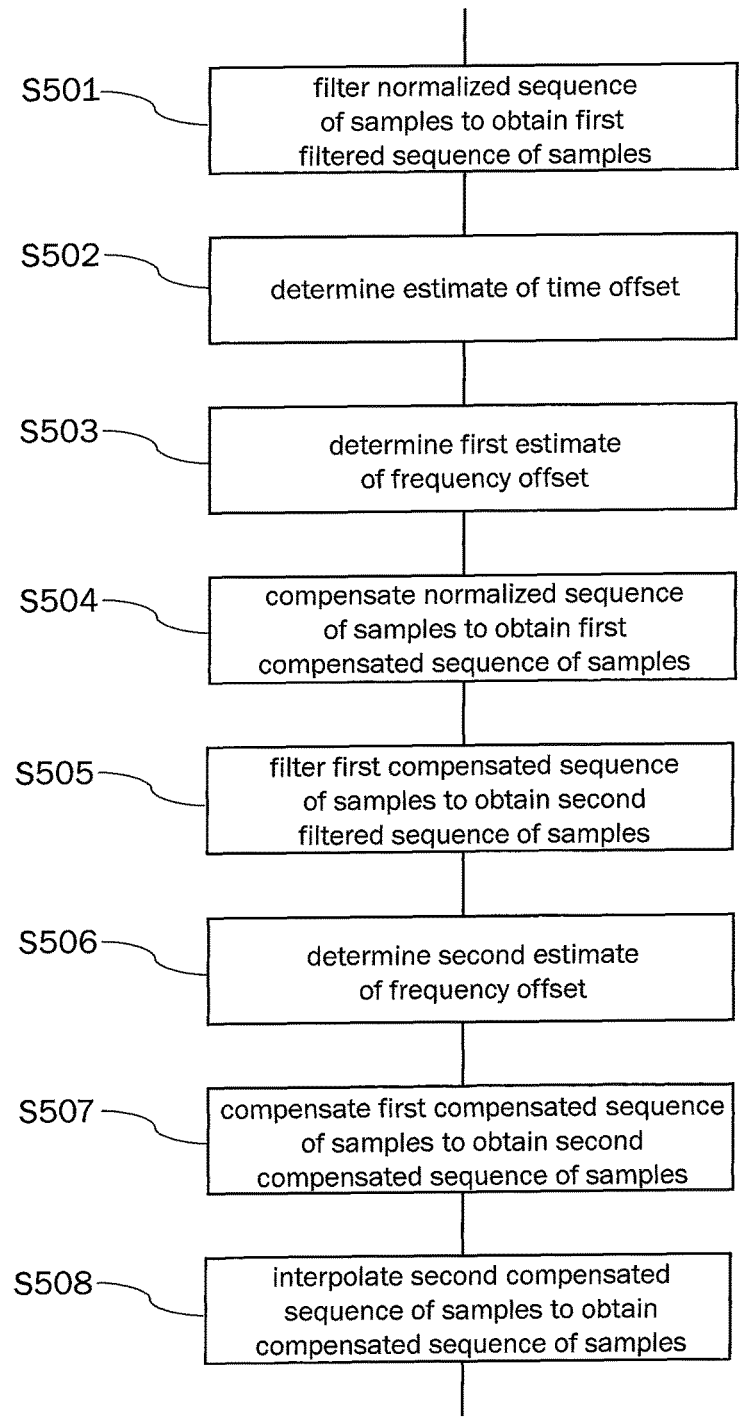
FIG. 5 is a flow chart illustrating a process flow for estimating the time offset and the frequency offset of the received signal in the time and frequency estimator of FIG. 4.

A first implementation 400 of the timing and frequency estimator 232 is illustrated in the block diagram of FIG. 4. Operation of the first implementation 400 is illustrated in the flow chart of FIG. 5.

According to the first implementation 400, the timing and frequency estimator comprises a first low-pass filter 401, a timing estimator 402 (time offset estimation means), a first frequency estimator 403 (first frequency estimation means), a second low-pass filter 405, a second frequency estimator 406 (second frequency estimation means), first and second compensators 404, 407 (first and second compensation means), and an interpolator 408 (interpolation means) which is a quadratic interpolator.

The first implementation 400 is roughly based on the synchronization algorithm (Mengali-Morelli algorithm) proposed in M. Morelli and U. Mengali, Joint frequency and timing recovery for MSK-type modulation, IEEE Trans. Commun., vol. 47, pp. 938-946, June 1999. After the limiter 231, the received and normalized samples $\{r_n\}$ (for reasons of simplicity of notation, the prime indicating the normalized samples will be dropped in the following) are filtered using the first low-pass filter 401, implemented through a finite impulse response (FIR) filter with a limited number of coefficients, having bandwidth $B_{LP}$ which is a design parameter of the synchronization algorithm. Let $\{z_n\}$ denote the filtered samples (first filtered sequence of samples), indexed from n=0 to n=$\eta L_0$−1, which correspond to $L_0$ signaling intervals ($L_0$=128 is the case of interest for the AIS scenario when packets of length 224 bits are considered, as those in the AIS 1 and 2 channels; when shorter packets of length 152 bits, as those in the AIS 3 channels, are considered, it can be assumed that $L_0$=88).

Next, the following coefficients $\hat{R}_m(i)$ are computed as a first result by auto-correlating the first filtered sequence of samples $z_n$ via $$\hat{R}_m(i) = \frac{1}{L_0 - m} \sum_{n=m}^{L_0-1} [z_{n\eta+i} z^*_{(n-m)\eta+i}]^2, \qquad \text{(eq. 3.2)}$$

for i∈{0, 1, ..., n−1} and m∈{1, 2, ..., $M_{\alpha1}$}, $M_{\alpha1}$ being a design parameter of the synchronization algorithm (preferably, a value of $M_{\alpha1}$=20 is selected). The estimate $\hat{\tau}$ of the time offset is then computed in the timing estimator 402 as $$\hat{\tau} = -\frac{T}{2\pi} \arg \left\{ \sum_{i=0}^{\eta-1} \sum_{m=1}^{M_{\alpha1}} A_1(m) |\hat{R}_m(i)| \exp\{-j2\pi i/\eta\} \right\}, \qquad \text{(eq. 3.3)}$$

where the terms $\{A_1(m)\}$ are real coefficients that can be pre-computed off-line, based only on the modulation format.

Finally, a first estimate $\hat{F}$ of the frequency offset is computed in the first frequency estimator 403 as $$\hat{F} = \frac{1}{4\pi M_{\alpha1} T} \sum_{m=1}^{M_{\alpha1}} \arg\{\mu_m \hat{R}_m(i_m) \hat{R}^*_{m-1}(i_{m-1})\}, \qquad \text{(eq. 3.4)}$$

where the terms $\{\mu_m\}$ are again real coefficients that can be pre-computed off-line, based only on the modulation format. For the modulation format of interest in the context of the present disclosure, $\mu_m$=−1 is obtained for all values of m. In (eq. 3.4), $\hat{R}_0(\cap)$ is conventionally equal to one, while the terms $\{i_m\}$ are computed according to the Mengali-Morelli algorithm, or by simply quantizing the value of $\hat{\tau}/T$ to the closest integer (modulo η). Thus, the first estimate $\hat{F}$ of the frequency offset is determined on the basis of the first result. In more detail, the first estimate $\hat{F}$ of the frequency offset is determined on the basis of the first result and the estimate $\hat{\tau}$ of the time offset.

Using the first estimate r of the frequency offset, the sequence of received and normalized samples $\{r_n'\}$ is compensated for the impact of the frequency offset of the received signal in the first compensator 404. Thereby, a first compensated sequence of samples is generated. In the frequency compensation, starting from the normalized samples $r_n'$, samples $r_n'' = r_n' e^{-j2\pi \hat{F} T_c}$ are defined, where $T_c$ is the sampling interval $$\left(T_c = \frac{T}{\eta}, \text{i.e., } T_c = \frac{T}{3}\right)$$

when three samples per symbol are used).

After a first frequency estimation and compensation, frequency estimation is performed again by using the same algorithm and a further compensation is performed. That is, the compensated samples are filtered using the second low-pass filter 405, implemented in the same manner as the first low-pass filter 401, to generate a second filtered sequence of samples. Then, coefficients $\hat{R}_m(i)$ are computed as a second result by auto-correlating the second filtered sequence of samples via (eq. 3.2). A second estimate $\hat{F}'$ of the frequency offset is computed in the second frequency estimator 406 via (eq. 3.4), i.e., on the basis of the second result. In more detail, the second estimate $\hat{F}'$ of the frequency offset is determined on the basis of the second result and the estimate $\hat{\tau}$ of the time offset. Subsequently, using the second estimate $\hat{F}'$ of the frequency offset, the first compensated sequence of samples is again compensated for the impact of the frequency offset of the received signal, this time in the second compensator 407. Thereby, a second compensated sequence of samples is generated.

Finally, quadratic interpolation of the second compensated sequence of samples is performed in the interpolator 408 based on the derived estimate $\hat{\tau}$ of the time offset in order to correct for the time offset. Thereby, the compensated sequence of samples is obtained that is later subjected to detection.

In the above, it is to be understood that the components of the timing and frequency estimator according to the first implementation 400 can be implemented either or both in hardware or software. Corresponding statements hold true also for the second to fourth implementations 600, 800, 1000 of the timing and frequency estimator that will be described below.

The operation of the first implementation 400 of the timing and frequency estimator described above is summarized in the flow chart of FIG. 5. At step S501, the normalized sequence of samples output by the limiter 231 is filtered using the first low-pass filter 401, thereby obtaining the first filtered sequence of samples.

At step S502, the estimate $\hat{\tau}$ of the time offset is determined on the basis of a first result obtained by auto-correlating the first filtered sequence of samples. The first result corresponds to the coefficients $\hat{R}_m(i)$ that are computed according to (eq. 3.2), using the filtered samples of the first filtered sequence of samples as an input. This step is performed in the timing estimator 402.

At step S503, the first estimate $\hat{F}$ of the frequency offset is determined on the basis of the first result. In more detail, the first estimate $\hat{F}$ of the frequency offset is determined on the basis of the estimate $\hat{\tau}$ of the time offset and the first result. This step is performed in the first frequency estimator 403.

Using the first estimate $\hat{F}$ of the frequency offset, at step S504 the normalized sequence of samples is compensated for the frequency offset of the received signal, thereby obtaining the first compensated sequence of samples. This step is performed in the first compensator 404.

Then, at step S505, the first compensated sequence of samples is filtered using the second low-pass filter 405, thereby obtaining the second filtered sequence of samples.

At step S506, the second estimate $\hat{F}'$ of the frequency offset is determined on the basis of a second result obtained by auto-correlating the second filtered sequence of samples. In more detail, the second estimate $\hat{F}'$ of the frequency offset is determined on the basis of the estimate $\hat{\tau}$ of the time offset and the second result. The second result corresponds to the coefficients $\hat{R}_m(i)$ that are computed according to (eq. 3.2), using the filtered samples of the second filtered sequence of samples as an input. This step is performed in the second frequency estimator 406.

Using the second estimate $\hat{F}'$ of the frequency offset, at step S506 the first compensated sequence of samples is compensated again for the frequency offset of the received signal, thereby obtaining the second compensated sequence of samples. This step is performed in the second compensator 407.

Lastly, at step S508 the second compensated sequence of samples is quadratically interpolated on the basis of the estimate $\hat{\tau}$ of the time offset in order to correct for the time offset. Thereby, the compensated sequence of samples is obtained. This step is performed in the interpolator 408.

With respect to the timing and frequency estimation in the prior art receiver disclosed by EP 2 315 366 A1, there are major differences that allow for an improvement of the estimation performance. First of all, the prior art algorithm operates on the samples before the limiter, employs 10 auto-correlation terms instead of 20 used in the present disclosure, and finally performs only one instance of frequency estimation.

Figure 6:
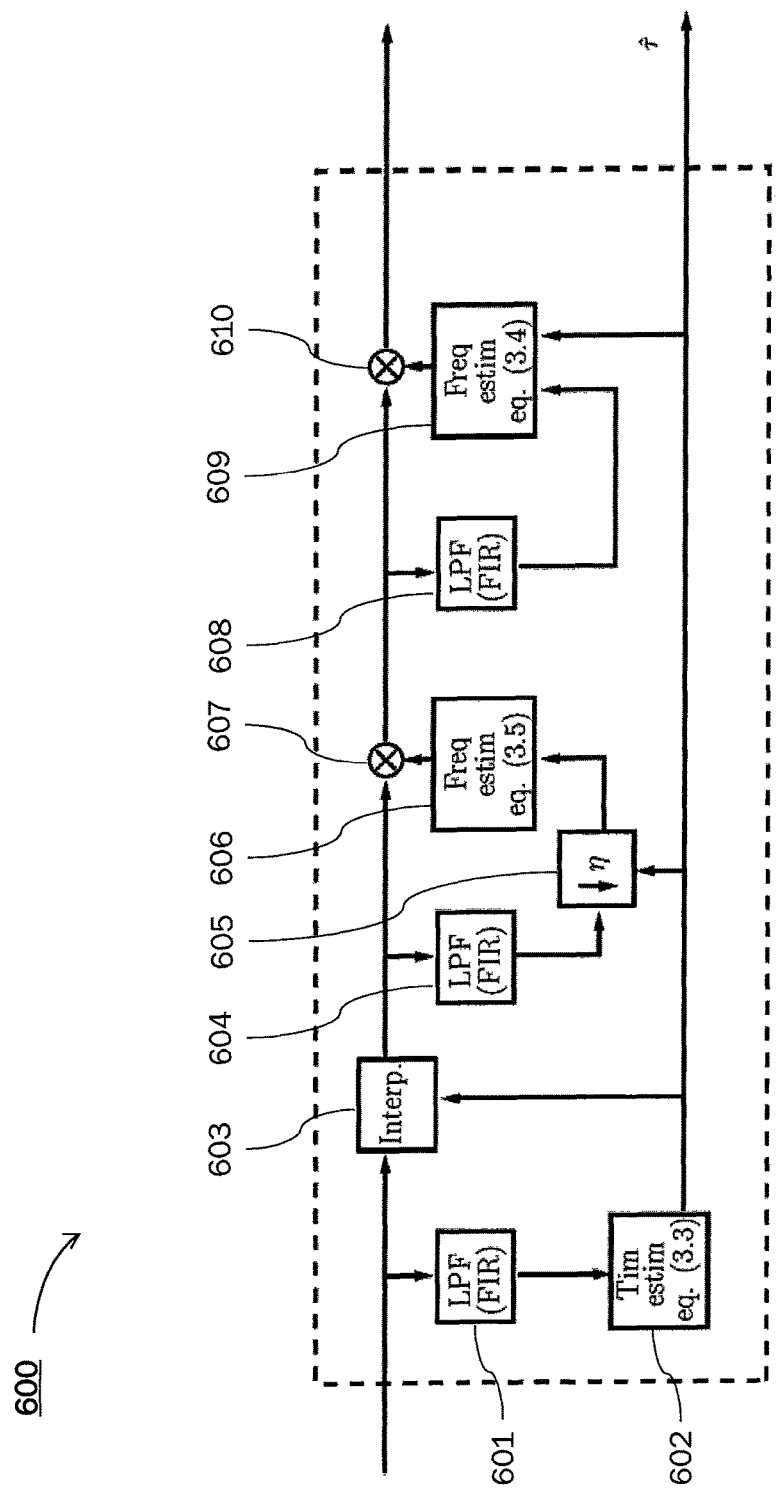
FIG. 6 is a schematic representation of a time and frequency estimator in the receiver of FIG. 2 for estimating a time offset and a frequency offset of the received signal according to another embodiment of present disclosure.

A second implementation 600 of the timing and frequency estimator is illustrated in the block diagram of FIG. 6. Operation of the second implementation 600 is illustrated in the flow chart of FIG. 7.

According to the second implementation 600, the timing and frequency estimator comprises a first low-pass filter 601, a timing estimator 602 (time offset estimation means), an interpolator 603 (interpolation means) which is a quadratic interpolator, a second low-pass filter 604, a down-sampler 605 (down-sampling means), a first frequency estimator 606 (first frequency offset estimation means), a third low-pass filter 608, a second frequency estimator 609 (second frequency offset estimation means), and first and second compensators 607, 610 (first and second compensation means).

According to the second implementation 600 of the timing and frequency estimator, timing is estimated first by using the Mengali-Morelli algorithm, i.e., via (eq. 3.2) and (eq. 3.3), as in the first implementation 400, but now adopting only the even auto-correlation terms. That is, in (eq. 3.3) only terms with m even are taken into account. The normalized samples output by the limiter 231 are interpolated and filtered again, and then used to perform a coarse frequency estimation by using the algorithm (Mehlan-Chen-Meyr algorithm) proposed in R. Mehlan, Y.-E. Chen, H. Meyr, A fully digital feedforward MSK demodulator with joint frequency offset and symbol timing estimation for burst mode mobile radio, IEEE Trans. Veh. Tech., vol. 42, pp. 434-443, November 1993. In the Mehlan-Chen-Meyr algorithm the estimate r of the frequency offset is obtained as $$\hat{F} = \frac{1}{4\pi T}\arg\left\{\sum_{n=1}^{L_0} y_n^2(y_{n-1}^2)^*\right\}, \quad \text{(eq. 3.5)}$$

where $\{y_n\}$ are the samples after limiter, interpolation, filtering and down-sampling by a factor and $L_0$ is still equal to 128. Then, a fine frequency estimation is performed by still using the Mengali-Morelli algorithm (see (eq. 3.4)) but adopting only the even auto-correlation terms.

In more detail, the received and normalized samples $\{r_n\}$ are filtered using the first low-pass filter 601, thereby generating a first filtered sequence of samples $\{z_n\}$. For details on the first low-pass filter 601, and also on the second and third low-pass filters 604, 608 it is referred to the above description of the first implementation 400. Next, the coefficients $\hat{R}_m(i)$ are computed as a first result by auto-correlating the first filtered sequence of samples $z_n$ via (eq. 3.2), and the estimate $\hat{\tau}$ of the time offset is computed in the timing estimator 602 via (eq. 3.3) on the basis of the first result. Thus, the timing estimator 602 is identical in operation to the timing estimator 402 according to the first implementation 400.

Next, quadratic interpolation of the received and normalized samples $\{r_n\}$ is performed in the interpolator 603 based on the derived estimate $\hat{\tau}$ of the time offset in order to correct for the time offset. Thereby, am interpolated sequence of samples is obtained.

The interpolated sequence of samples is filtered using the second low-pass filter 604, implemented in the same manner as the first low-pass filter 601, thereby generating a second filtered sequence of samples. The second filtered sequence of samples is down-sampled in the down-sampler 605 from $\eta=3$ samples per bit interval to $\eta=1$ samples per bit interval, thereby obtaining a first down-sampled sequence of samples. In this process, the (real) estimate of the time offset $\tau$ is expressed as $\tau=iT_c+\alpha$, where $\alpha<T_c$ is used for the interpolation. Therein, i is a running index and identifies the samples that have to be kept when performing the down-sampling.

Then, a (coarse) first estimate $\hat{F}$ of the frequency offset is determined in the first frequency estimator 606 by auto-correlating the first down-sampled sequence of samples via (eq. 3.5), i.e., by using the Mehlan-Chen-Meyr algorithm. Here, it can be said that the first estimate $\hat{F}$ of the frequency offset is determined on the basis of a second result obtained by auto-correlating the first down-sampled sequence of samples, the first result corresponding to the sum in (eq. 3.5) using the samples of the first down-sampled sequence of samples as an input.

Using the first estimate $\hat{F}$ of the frequency offset, the interpolated sequence of samples is compensated for the impact of the frequency offset of the received signal in the first compensator 607. Thereby, a first compensated sequence of samples is generated.

After the first frequency estimation and compensation, frequency estimation is performed again by using the Mengali-Morelli algorithm and a further compensation is performed. That is, the first compensated sequence of samples is filtered using the third low-pass filter 608, implemented in the same manner as the first low-pass filter 601, to generate a third filtered sequence of samples. Then, coefficients $\hat{R}_m(i)$ are computed as a third result by auto-correlating the third filtered sequence of samples via (eq. 3.2). A (fine) second estimate $\hat{F}'$ of the frequency offset is computed in the second frequency estimator 609 via (eq. 3.4), i.e., on the basis of the third result. In more detail, the second estimate $\hat{F}'$ of the frequency offset is determined on the basis of the third result and the estimate $\hat{\tau}$ of the time offset. Thus, the second frequency estimator 609 is identical in operation to the first and second frequency estimators 404, 406 according to the first implementation 400. Subsequently, using the second estimate $\hat{F}'$ of the frequency offset, the first compensated sequence of samples is again compensated for the impact of the frequency offset of the received signal, this time in the second compensator 607. Thereby, the compensated sequence of samples is obtained that is later subjected to detection.

The operation of the second implementation 600 of the timing and frequency estimator described above is summarized in the flow chart of FIG. 7. At step S701, the normalized sequence of samples output by the limiter 231 is filtered using the first low-pass filter 601, thereby obtaining the first filtered sequence of samples.

At step S702, the estimate $\hat{\tau}$ of the time offset is estimated on the basis of a first result obtained by auto-correlating the first filtered sequence of samples. The first result corresponds to the coefficients $\hat{R}_m(i)$ that are computed according to (eq. 3.2), using the filtered samples of the first filtered sequence of samples as an input and adopting only the even auto-correlation terms. This step is performed in the timing estimator 602.

At step S703, the normalized sequence of samples is interpolated on the basis of the estimate $\hat{\tau}$ of the time offset in order to correct for the time offset, thereby obtaining the interpolated sequence of samples. This step is performed in the interpolator 603.

At step S704, the interpolated sequence of samples is filtered using the second low-pass filter 604, thereby obtaining the second filtered sequence of samples.

At step S705, the second filtered sequence of samples is down-sampled to obtain the first down-sampled sequence of samples. Here, down-sampling is performed from $\eta=3$ to $\eta=1$. If an initial value for $\eta$ different from 3 is chosen, down-sampling by the initial value of $\eta$ is performed, so that after down-sampling, $\eta=1$ is obtained. This step is performed in the down-sampler 605.

Then, at step S706, the first estimate of the frequency offset is determined on the basis of a second result obtained by auto-correlating the first down-sampled sequence of samples. The second result corresponds to the sum in (eq. 3.5), using the first down-sampled sequence of samples as an input. This step is performed in the first frequency estimator 606.

Using the first estimate $\hat{F}$ of the frequency offset, at step S707 the interpolated sequence of samples is compensated for the frequency offset of the received signal, thereby obtaining the first compensated sequence of samples. This step is performed in the first compensator 607.

At step S708, the first compensated sequence of samples is filtered using the third low-pass filter 608, thereby obtaining the third filtered sequence of samples.

At step S709, the second estimate $\hat{F}'$ of the frequency offset is determined on the basis of a third result obtained by auto-correlating the third filtered sequence of samples. In more detail, the second estimate $\hat{F}'$ of the frequency offset is determined on the basis of the estimate $\hat{\tau}$ of the time offset and the third result. The third result corresponds to the coefficients $R_m(i)$ that are computed according to (eq. 3.2), using the filtered samples of the third filtered sequence of samples as an input and adopting only the even auto-correlation terms. This step is performed in the second frequency estimator 609.

Using the second estimate $\hat{F}'$ of the frequency offset, at step S710 the first compensated sequence of samples is compensated again for the frequency offset of the received signal, thereby obtaining the compensated sequence of samples.

As becomes apparent from the above description of the second implementation 600, the auto-correlation algorithm that is applied to the first filtered sequence of samples to obtain the first result (i.e., the Mengali-Morelli algorithm) is different from the auto-correlation algorithm that is applied to the first down-sampled sequence of samples to obtain the second result (i.e., the Mehlan-Chen-Meyr algorithm). On the other hand, the auto-correlation algorithm that is applied to the first filtered sequence of samples to obtain the first result (i.e., the Mengali-Morelli algorithm) is also applied to the third filtered sequence of samples to obtain the third result.

Figure 8:
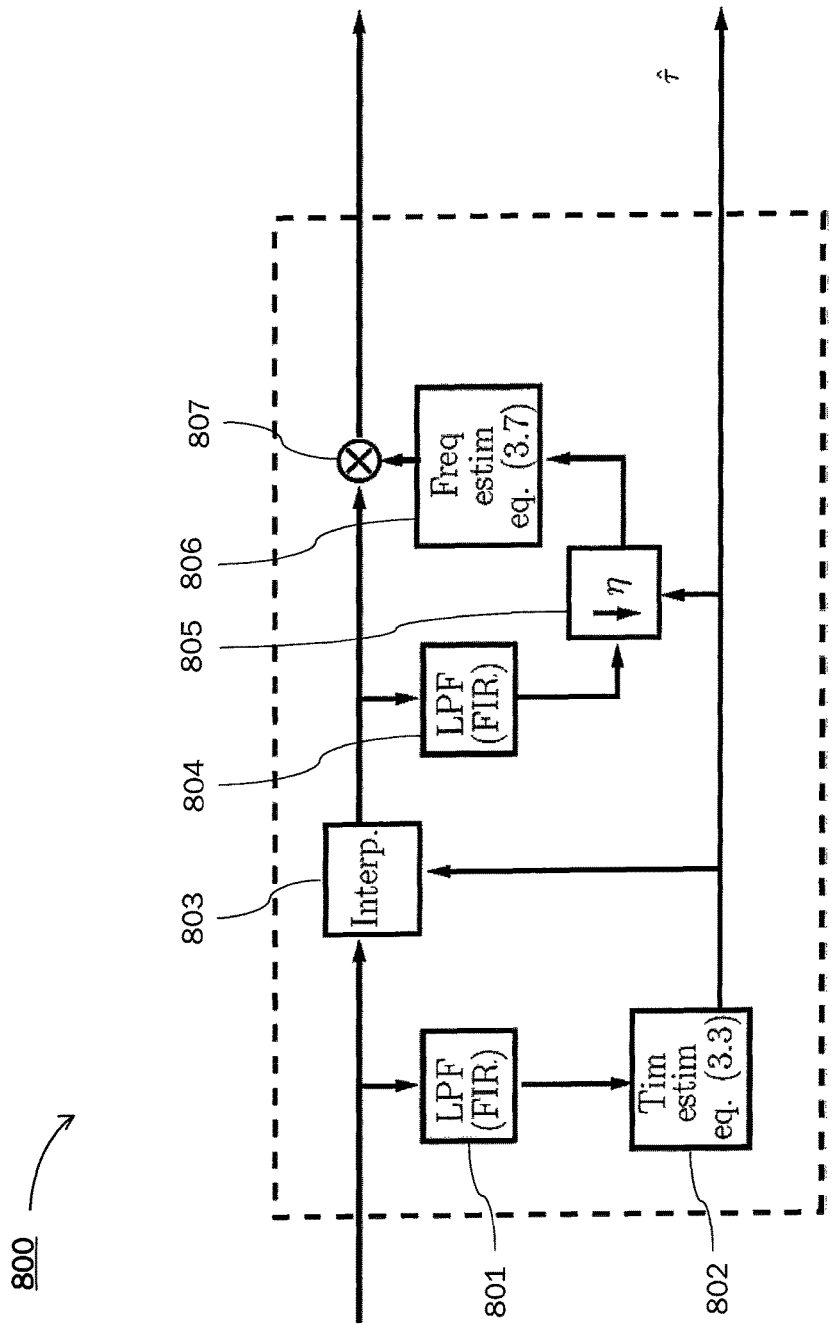
FIG. 8 is a schematic representation of a time and frequency estimator in the receiver of FIG. 2 for estimating the time offset and the frequency offset of the received signal according to another embodiment of present disclosure.
Figure 9:
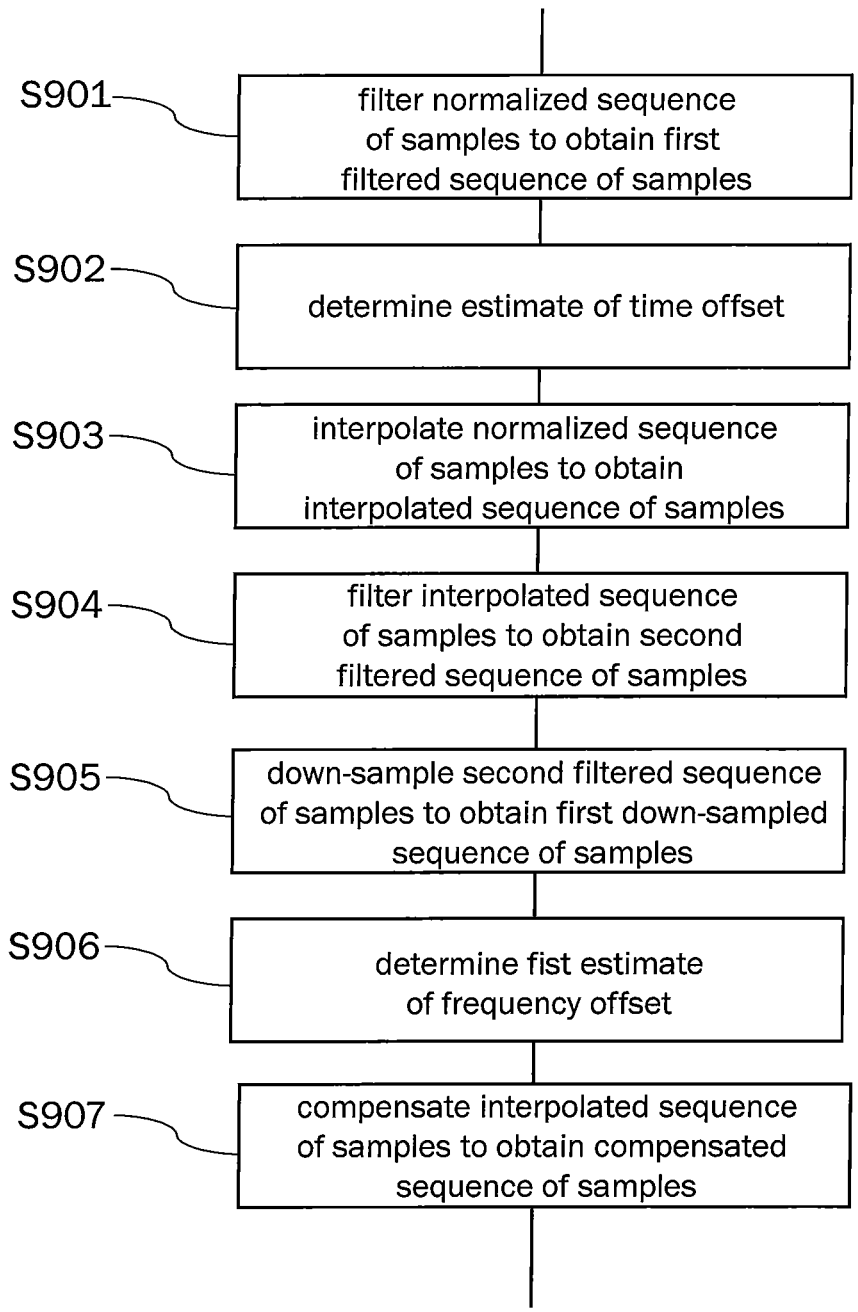
FIG. 9 is a flow chart illustrating a process flow for estimating the time offset and the frequency offset of the received signal in the time and frequency estimator of FIG. 8.

A third implementation 800 of the timing and frequency estimator is illustrated in the block diagram of FIG. 8. Operation of the third implementation 800 is illustrated in the flow chart of FIG. 9.

According to the third implementation 800, the timing and frequency estimator comprises a first low-pass filter 801, a timing estimator 802 (time offset estimation means), an interpolator 803 (interpolation means) which is a quadratic interpolator, a second low-pass filter 804, a down-sampler 805 (down-sampling means), a (first) frequency estimator 806 (first frequency offset estimation means), and a (first) compensator 807 (first compensation means).

According to the third implementation 800 of the timing and frequency estimator, timing is estimated first by using the Mengali-Morelli algorithm, i.e., via (eq. 3.2) and (eq. 3.3), as in the first implementation 400, but now adopting only the even auto-correlation terms. The normalized samples output by the limiter 231 are then interpolated, filtered again, and down-sampled, obtaining samples $\{y_n\}$. These latter samples are then employed for frequency estimation by using the algorithm (DA Mengali-Morelli algorithm) described in U. Mengali, M. Morelli, Data-aided frequency estimation for burst digital transmission, IEEE Trans. Commun., vol. 45, pp. 23-25, January 1997.

According to the DA Mengali-Morelli algorithm, first the following coefficients are computed $$R(m) = \frac{1}{L_0 - m} \sum_{n=m}^{L_0-1} v_n v_{n-m}^* \quad \text{(eq. 3.6)}$$

for $m \in \{1, 2, \ldots, M_{\alpha 3}\}$, where $L_0=128$, $M_{\alpha 3}$ is a design parameter not greater than $L_0/2$ (preferably, $M_{\alpha 3}=L_0/2$ is selected), and $v_n=(-1)^n y_n^2$. Then, the estimate $\hat{F}$ of the frequency offset can be expressed as $$\hat{F} = \frac{1}{4\pi M_{\alpha 3} T} \sum_{m=1}^{M_{\alpha 3}} w(m)[\arg\{R(m)\} - \arg\{R(m-1)\}]_{2\pi} \quad \text{(eq. 3.7)}$$

where $$w(m) = \frac{3[(L_0 - m)(L_0 - m + 1) - M_{\alpha 3}(L_0 - M_{\alpha 3})]}{M_{\alpha 3}(4M_{\alpha 3}^2 - 6M_{\alpha 3}L_0 + 3L_0^2 - 1)}. \quad \text{(eq. 3.8)}$$

It is to be noted that according to the third implementation 800 only a single instance of frequency estimation is performed.

In more detail, the received and normalized samples $\{r_n\}$ are filtered using the first low-pass filter 801, thereby generating a first filtered sequence of samples $\{z_n\}$. For details on the first low-pass filter 801, and also on the second low-pass filter 804 it is referred to the above description of the first implementation 400. Next, the coefficients $\hat{R}_m(i)$ are computed as a first result by auto-correlating the first filtered sequence of samples $z_n$ via (eq. 3.2), and the estimate $\hat{\tau}$ of the time offset is computed in the timing estimator 802 via (eq. 3.3) on the basis of the first result, but adopting only the even auto-correlation terms. Thus, the timing estimator 802 is identical in operation to the timing estimator 402 according to the first implementation 400.

Next, quadratic interpolation of the received and normalized samples $\{r_n\}$ is performed in the interpolator 803 based on the derived estimate $\hat{\tau}$ of the time offset in order to correct for the time offset. Thereby, am interpolated sequence of samples is obtained.

The interpolated sequence of samples is filtered using the second low-pass filter 804, implemented in the same manner as the first low-pass filter 801, thereby generating a second filtered sequence of samples. The second filtered sequence of samples is down-sampled in the down-sampler 805 from $\eta=3$ samples per bit interval to $\eta=1$ samples per bit interval, thereby obtaining a first down-sampled sequence of samples. Then, an estimate r of the frequency offset is determined in the frequency estimator 806 by auto-correlating the first down-sampled sequence of samples via (eq. 3.6), i.e., by using the DA Mengali-Morelli algorithm. Here, it can be said that the estimate $\hat{F}$ of the frequency offset is determined on the basis of a second result obtained by auto-correlating the first down-sampled sequence of samples, the first result corresponding to the coefficients R(m) calculated via (eq. 3.6), using the samples of the first down-sampled sequence of samples as an input.

Using the estimate $\hat{F}$ of the frequency offset, the interpolated sequence of samples is compensated for the impact of the frequency offset of the received signal in the compensator 807. Thereby, the compensated sequence of samples is generated that is later subjected to detection.

The operation of the third implementation 800 of the timing and frequency estimator described above is summarized in the flow chart of FIG. 9. At step S901, the normalized sequence of samples output by the limiter 231 is filtered using the first low-pass filter 801, thereby obtaining the first filtered sequence of samples.

At step S902, the estimate $\hat{\tau}$ of the time offset is estimated on the basis of a first result obtained by auto-correlating the first filtered sequence of samples. The first result corresponds to the coefficients $\hat{R}_m(i)$ that are computed according to (eq. 3.2), using the filtered samples of the first filtered sequence of samples as an input and adopting only the even auto-correlation terms. This step is performed in the timing estimator 802.

At step S903, the normalized sequence of samples is quadratically interpolated on the basis of the estimate $\tau$ of the time offset in order to correct for the time offset, thereby obtaining the interpolated sequence of samples. This step is performed in the interpolator 803.

At step S904, the interpolated sequence of samples is filtered using the second low-pass filter 804, thereby obtaining the second filtered sequence of samples.

At step S905, the second filtered sequence of samples is down-sampled to obtain the first down-sampled sequence of samples. Here, down-sampling is performed from $\eta=3$ to $\eta=1$. If an initial value for $\eta$ different from 3 is chosen, down-sampling by the initial value of $\eta$ is performed, so that after down-sampling, $\eta=1$ is obtained. This step is performed in the down-sampler 805.

Then, at step S906, the estimate $\hat{F}$ of the frequency offset is determined on the basis of a second result obtained by auto-correlating the first down-sampled sequence of samples. The second result corresponds to the coefficients R(m) that are computed according to (eq. 3.6), using the samples of the down-sampled sequence of samples as an input. This step is performed in the frequency estimator 806.

Using the estimate $\hat{F}$ of the frequency offset, at step S907 the interpolated sequence of samples is compensated for the frequency offset of the received signal, thereby obtaining the compensated sequence of samples. This step is performed in the compensator 807.

It is to be noted that steps S901 to S906 correspond to steps S701 to S706, with the exception that in step S906 the DA Mengali-Morelli algorithm instead of the Mehlan-Chen-Meyr algorithm is employed for determining the estimate F of the frequency offset.

As becomes apparent from the above description of the third implementation 800, the auto-correlation algorithm that is applied to the first filtered sequence of samples to obtain the first result (i.e., the Mengali-Morelli algorithm) is different from the auto-correlation algorithm that is applied to the first down-sampled sequence of samples to obtain the second result (i.e., the DA Mengali-Morelli algorithm).

Figure 10:
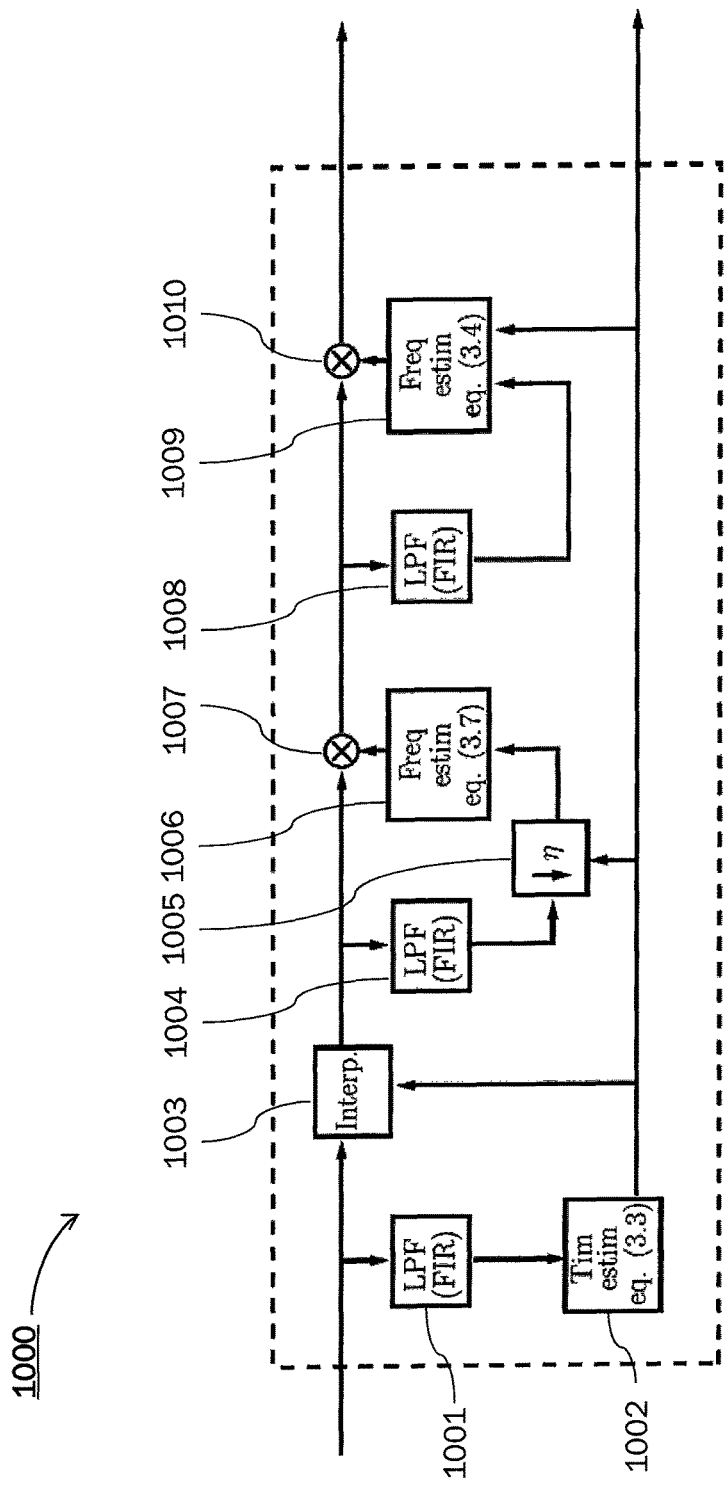
FIG. 10 is a schematic representation of a time and frequency estimator in the receiver of FIG. 2 for estimating the time offset and the frequency offset of the received signal according to another embodiment of present disclosure.

A fourth implementation 1000 of the timing and frequency estimator is illustrated in the block diagram of FIG. 10.

According to the fourth implementation 1000, the timing and frequency estimator comprises a first low-pass filter 1001, a timing estimator 1002 (time offset estimation means), an interpolator 1003 (interpolation means) which is a quadratic interpolator, a second low-pass filter 1004, a down-sampler 1005 (down-sampling means), a first frequency estimator 1006 (first frequency offset estimation means), a third low-pass filter 1008, a second frequency estimator 1009 (second frequency offset estimation means), and first and second compensators 1007, 1010 (first and second compensation means).

According to the fourth implementation 1000 of the timing and frequency estimator, the same steps as described in connection with the third implementation 800 are executed, followed by a fine frequency estimation performed by still using the Mengali-Morelli algorithm, i.e., via (eq. 3.2) and (eq. 3.3), as in the first implementation 400, but now adopting only the even auto-correlation terms.

In more detail, the received and normalized samples $\{r_n\}$ are filtered using the first low-pass filter 1001, thereby generating a first filtered sequence of samples $\{z_n\}$. For details on the first low-pass filter 1001, and also on the second and third low-pass filters 1004, 1008 it is referred to the above description of the first implementation 400. Next, the coefficients $\hat{R}_m(i)$ are computed as a first result by auto-correlating the first filtered sequence of samples $z_n$ via (eq. 3.2), and the estimate $\hat{\tau}$ of the time offset is computed in the timing estimator 1002 via (eq. 3.3) on the basis of the first result. Thus, the timing estimator 1002 is identical in operation to the timing estimator 402 according to the first implementation 400.

Next, quadratic interpolation of the received and normalized samples $\{r_n\}$ is performed in the interpolator 1003 based on the derived estimate $\hat{\tau}$ of the time offset in order to correct for the time offset. Thereby, am interpolated sequence of samples is obtained.

The interpolated sequence of samples is filtered using the second low-pass filter 1004, implemented in the same manner as the first low-pass filter 1001, thereby generating a second filtered sequence of samples. The second filtered sequence of samples is down-sampled in the down-sampler 1005 from η=3 samples per bit interval to η=1 samples per bit interval, thereby obtaining a first down-sampled sequence of samples.

Then, a first estimate $\hat{F}$ of the frequency offset is determined in the first frequency estimator 1006 by auto-correlating the first down-sampled sequence of samples via (eq. 3.6), i.e., by using the DA Mengali-Morelli algorithm. Here, it can be said that the estimate $\hat{F}$ of the frequency offset is determined on the basis of a second result obtained by auto-correlating the first down-sampled sequence of samples, the second result corresponding to the coefficients R(m) calculated via (eq. 3.6), using the samples of the first down-sampled sequence of samples as an input.

Using the first estimate $\hat{F}$ of the frequency offset, the interpolated sequence of samples is compensated for the impact of the frequency offset of the received signal in the first compensator 1007. Thereby, a first compensated sequence of samples is generated.

After the first frequency estimation and compensation, frequency estimation is performed again by using the Mengali-Morelli algorithm and a further compensation is performed. That is, the first compensated sequence of samples is filtered using the third low-pass filter 1008, implemented in the same manner as the first low-pass filter 1001, to generate a third filtered sequence of samples. Then, coefficients $\hat{R}_m(i)$ are computed as a third result by auto-correlating the third filtered sequence of samples via (eq. 3.2). A (fine) second estimate $\hat{F}'$ of the frequency offset is computed in the second frequency estimator 1009 via (eq. 3.4), i.e., on the basis of the third result. In more detail, the second estimate $\hat{F}'$ of the frequency offset is determined on the basis of the third result and the estimate $\hat{\tau}$ of the time offset. Thus, the second frequency estimator 1009 is identical in operation to the first and second frequency estimators 404, 406 according to the first implementation 400.

Subsequently, using the second estimate $\hat{F}'$ of the frequency offset, the first compensated sequence of samples is again compensated for the impact of the frequency offset of the received signal, this time in the second compensator 1007. Thereby, the compensated sequence of samples is obtained that is later subjected to detection.

Figure 7:
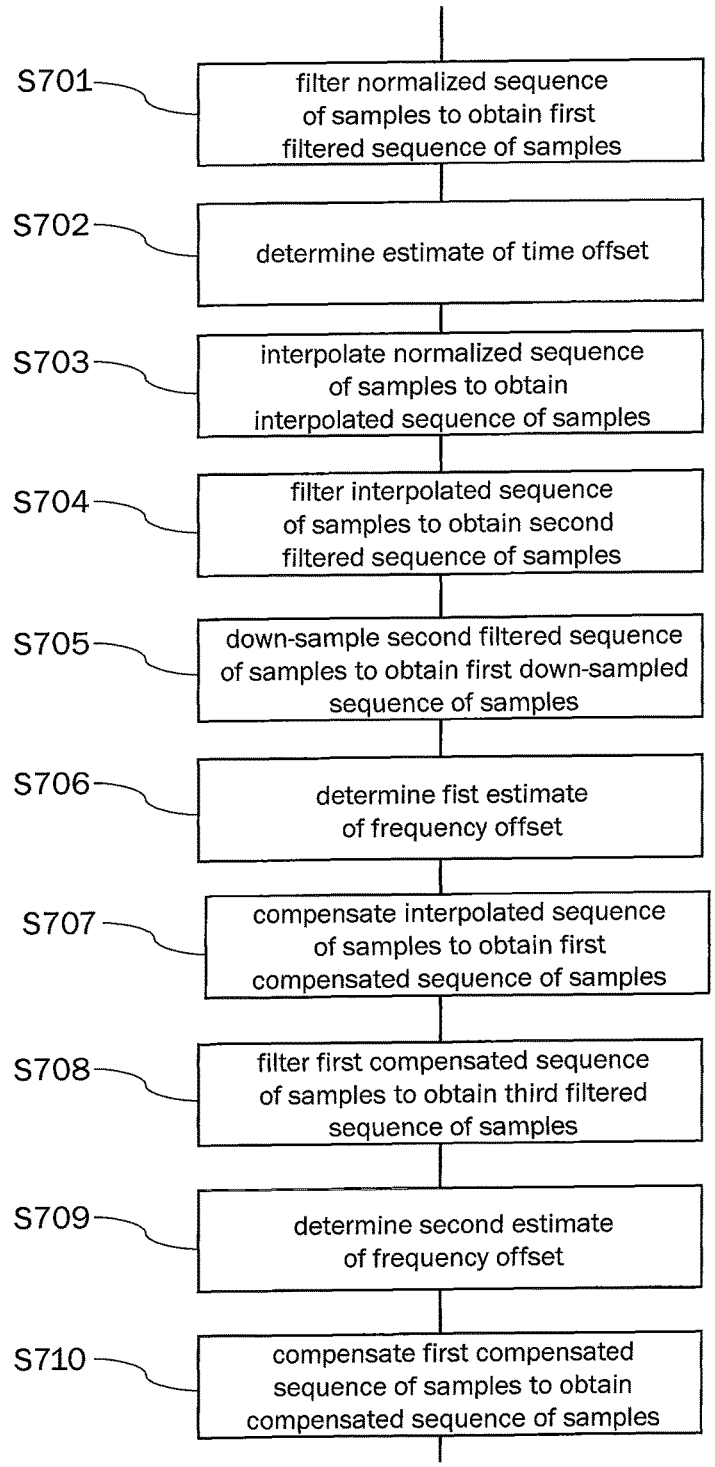
FIG. 7 is a flow chart illustrating a process flow for estimating the time offset and the frequency offset of the received signal in the time and frequency estimator of FIG. 6.

The operation of the fourth implementation 1000 of the timing and frequency estimator corresponds to the operation of the second implementation 600 of the timing and frequency estimator illustrated in the flow chart of FIG. 7, with the exception that in step S706 of FIG. 7 now the DA Mengali-Morelli algorithm instead of the Mehlan-Chen-Meyr algorithm is employed for determining the first estimate $\hat{F}$ of the frequency offset. Thus, instead of S706, the operation of the fourth implementation 1000 of the timing and frequency estimator comprises a step S706' in which the first estimate $\hat{F}$ of the frequency offset is determined on the basis of a second result obtained by auto-correlating the first down-sampled sequence of samples, wherein the second result corresponds to the coefficients R(m) calculated via (eq. 3.6), using the samples of the first down-sampled sequence of samples as an input.

As becomes apparent from the above description of the fourth implementation 1000, the auto-correlation algorithm that is applied to the first filtered sequence of samples to obtain the first result (i.e., the Mengali-Morelli algorithm) is different from the auto-correlation algorithm that is applied to the first down-sampled sequence of samples to obtain the second result (i.e., the DA Mengali-Morelli algorithm). On the other hand, the auto-correlation algorithm that is applied to the first filtered sequence of samples to obtain the first result (i.e., the Mengali-Morelli algorithm) is also applied to the third filtered sequence of samples to obtain the third result.

Through computer simulations it has been verified by the inventors that the fourth implementation 1000 outperforms the first to third implementations 400, 600, 800 both in presence and in absence of long sequences of zeros in the data field of respective AIS messages.

In the above, it has been assumed that the receiver 200 comprises the limiter 231 and that a normalized sequence of samples that is output by the limiter 231 is input to the timing and frequency estimator 232. However, if desired, the limiter may also be omitted, thereby decreasing complexity of the receiver 200, however at the cost of degradation of receiver performance in the presence of long sequences of zeros in the data field of respective AIS messages and/or heavy interference between messages. The first to fourth implementations 400, 600, 800, 1000 of the timing and frequency estimator as discussed above are also applicable to a receiver 200 not comprising the limiter 231, in which case the sequence of samples $\{r_n\}$ is fed to the timing and frequency estimator 232 without prior normalization. In the above description of the first to fourth implementations 400, 600, 800, 1000 of the timing and frequency estimator, the normalized sequence of samples output by the limiter 231 would thus have to be replaced by the sequence of samples generated from the received signal.

Detection Stage

Next, the detection unit 235 and its operation will be described. An important difference of the detection unit 235 with respect to the detection unit in the prior art receiver disclosed in EP 2 315 366 A1 is that instead of Viterbi-based detection now a soft-input soft-output (SISO) algorithm is employed.

In a preferred embodiment of the disclosure, the symbols correspond to bits, so that each symbol may take values +1 or −1 (or equivalently, 1 and 0). The following description of the algorithm employed by the detection unit 235 is given for this particular case. However, the present disclosure shall not be construed as being limited to this particular case.

For the selected detection algorithm, the knowledge of the phase shift introduced by the channel is not necessary since the detection algorithm performs an implicit phase estimation. This algorithm is based on the Laurent decomposition (eq. 1.13) and was originally proposed in A. Barbieri, G. Colavolpe, Simplified soft-output detection of CPM signals over coherent and phase noise channels, IEEE Trans. Wireless Commun., vol. 6, pp. 2486-2496, July 2007.

The received signal (i.e., the sequence of samples generated therefrom), after frequency and timing estimation and compensation, is filtered using the matched filter (oversampled filter) 233, 234 which is matched to the principal pulse of the Laurent decomposition. One sample per symbol interval is retained at the output of the matched filter 233, 234 using the information provided by the timing synchronizer, i.e., the estimate $\hat{\tau}$ of the time offset. In the following, $x_n$ will denote a sample at discrete-time n. The channel phase is quantized to the Q values of the alphabet $$\Psi = \left\{0, \frac{2\pi}{Q}, \ldots, \frac{2\pi}{Q}(Q-1)\right\},$$

being a design parameter to trade performance against complexity. The channel phase probability density function (PDF) becomes a probability mass function (PMF) and $P_{f,n}(\psi_n)$ and $P_{b,n}(\psi_n)$ will be used to denote the estimates of the channel phase PMF in the forward and backward recursion, respectively. The expression of the forward recursion—the backward recursion proceeds similarly—is given by $$P_{f,n}(\psi_n) = \qquad \text{(eq. 3.9)}$$

$$H_n(\psi_n)\Big[(1-P_\Delta)P\{\alpha_n=-1\}P_{f,n-1}(\psi_n) + (1-P_\Delta)P\{\alpha_n=1\}$$

$$P_{f,n-1}(\psi_n+\pi) + \frac{P_\Delta}{2}P\{\alpha_n=-1\}P_{f,n-1}\left(\psi_n+\frac{2\pi}{Q}\right) +$$

$$\frac{P_\Delta}{2}P\{\alpha_n=-1\}P_{f,n-1}\left(\psi_n-\frac{2\pi}{Q}\right) +$$

$$\frac{P_\Delta}{2}P\{\alpha_n=1\}P_{f,n-1}\left(\psi_n+\frac{2\pi}{Q}+\pi\right) +$$

$$\frac{P_\Delta}{2}P\{\alpha_n=1\}P_{f,n-1}\left(\psi_n-\frac{2\pi}{Q}+\pi\right)\Big],$$

where $0<P_\Delta<1$ is a design parameter, optimized depending on the speed of variation of the channel phase $H_n(\psi_n)$, which is given by $$H_n(\psi_n) = \exp\left\{\text{Re}\left[\frac{1}{N_0}x_n e^{j\pi h(n+1)}e^{-j\psi_n}\right]\right\}, \qquad \text{(eq. 3.10)}$$

and $P\{\alpha_n=1\}$, $P\{\alpha_n=1\}$ are the a-priori probabilities (APP) of the symbols. In the case of a residual frequency error, the parameter $P_A$ has to be optimized accordingly. For the purpose of the below discussion, the a-priori probabilities have been set to 0.5, but in a case in which some symbols of the transmitted message are known at the receiver, it is possible to significantly improve the performance of the detection algorithm by including the a-priori probabilities of the known symbols in the detection process. The PMFs computed during the forward and backward recursions are employed in the final completion giving the symbol APPs:

$$P(\alpha_n \mid x) = \sum_{\psi_n \in \Psi} P_{b,n}(\psi_n)\Big[(1-P_\Delta)P(\overline{\alpha}_n)P_{f,n-1}(\psi_n-\pi\overline{\alpha}_n) + \qquad \text{(eq. 3.11)}$$

$$\frac{P_\Delta}{2}P(\overline{\alpha}_n)P_{f,n-1}\left(\psi_n-\pi\overline{\alpha}_n+\frac{2\pi}{Q}\right) +$$

$$\frac{P_\Delta}{2}P(\overline{\alpha}_n)P_{f,n-1}\left(\psi_n-\pi\overline{\alpha}_n-\frac{2\pi}{Q}\right)\Big].$$

From the APPs $P(\alpha_n=1|x)$ and $P(\alpha_n=-1|x)$, the logarithmic likelihood ratio (LLR) $L_n$ is computed via $$L_n = \ln\frac{P\{\alpha_n-1 \mid x\}}{P\{\alpha_n=-1 \mid x\}}. \qquad \text{(eq. 3.12)}$$

On the basis thereof, the receiver takes a decision on symbol $\alpha_n$ that is ruled by $$\hat{\alpha}_n = \text{sign}[L_n],$$

where $|L_n|$ is an estimate of the reliability of this decision—the larger its value the more reliable the corresponding decision.

The algorithm described above is more conveniently implemented in the logarithmic domain. It turns out that in this case it is required to compute the logarithm of the sum of exponentials (the Jacobian logarithm), which results to be $$\ln(e^{x1}+e^{x2}) = \max(x_1,x_2) + \ln(1+e^{-|x1-x2|}) \lesssim \max(x_1,x_2).$$

This detection algorithm is a soft-input soft-output algorithm. This means that an estimate of the ratio between the signal amplitude and the noise power spectral density (PSD) $N_0$ must be available (see (eq. 3.10)). However, in the absence of channel coding this is not critical. On the contrary, the availability of soft decisions represents a powerful tool to improve the receiver performance. In fact, although a channel coding scheme is not adopted in the AIS scenario, the CRC can be used to improve the performance of the adopted SISO detection algorithm by using the post-processing methods described below.

As becomes apparent from the above, employing the SISO algorithm in the detection unit 235, each of the determined symbols in the step of determining a sequence of symbols is a symbol that has a highest probability of being identical to the corresponding transmitted symbol. Thus, operation of the receiver 200 further comprises, for each determined symbol, determining a probability of the determined symbol being identical to the corresponding transmitted symbol.

Figure 11:
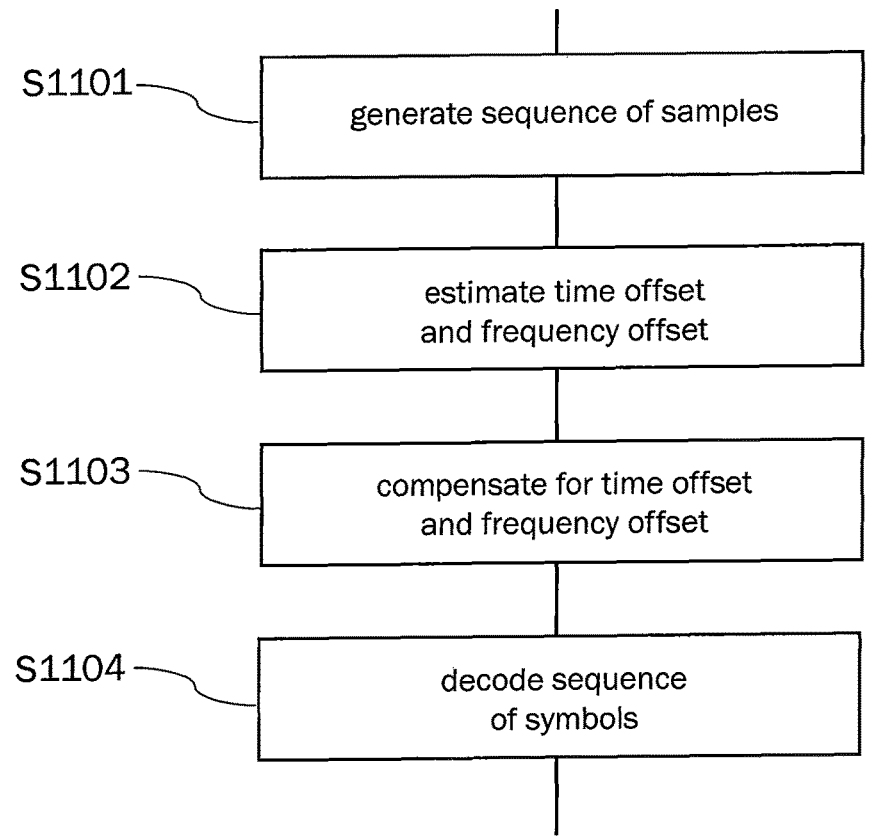
FIG. 11 is a flow chart illustrating a process flow for estimating the time offset and the frequency offset of the received signal in the time and frequency estimator of FIG. 10.

The flow chart of FIG. 11 illustrates the operation of the receiver 200, i.e., a procedure for demodulating a received signal relating to a sequence of transmitted symbols that have been modulated by continuous phase modulation, when the SISO algorithm is employed in the detection unit 235.

At step S1101, a sequence of samples $r_n$ is generated from the received signal. This step is performed at the front end unit 201, which in this sense acts as sampling means.

At step S1102, a time offset and a frequency offset of the received signal are estimated on the basis of the sequence of samples. Further, at step S1103, the estimated time offset and the estimated frequency offset are used for compensating (correcting) the sequence of samples for time and frequency offsets, thereby obtaining a compensated sequence of samples. Both steps S1102 and S1103 are performed in the timing and frequency estimator 232, which in this sense acts as estimation means.

At step S1104, a sequence of symbols corresponding to the transmitted sequence of symbols is determined on the basis of the compensated sequence of samples. Therein, each of the determined symbols is a symbol that has a highest probability of being identical to the corresponding transmitted symbol, i.e., each of the determined symbols is a symbol $\hat{\alpha}_n = \text{sign}[L_n]$ with $L_n$ calculated according to (eq. 3.12). This step is performed in the detection unit 235, which in this sense acts as demodulation means.

It is to be noted that FIG. 11 corresponds to a case in which the limiter 231 has been omitted from the receiver 200. Alternatively, a further step analogous to step S302 in FIG. 3 relating to a normalization of the received samples could be inserted between steps S1101 and S1102. In this case, steps S1102 and S1103 would be performed on the normalized sequence of samples.

Post-Processing Stage

Next, two post-processing techniques to be employed by the post-processing unit 236 of the receiver 200 will be described. It is noted that such post-processing is not performed in the prior art receiver disclosed in EP 2 315 366 A1.

Continuous phase modulation is characterized by an intrinsic differential encoding. This means that at high signal-to-noise ratio (SNR) values, errors occur in couples (pairs) of consecutive bits. Considering the additional stage of differential encoding foreseen by the AIS standard, the error patterns at high SNR values are in the form "wcw", where "w" represents a wrong bit and "c" a correct one. In addition, at high SNR values when a packet is wrong, usually a single couple of bit errors occurs.

In view of this finding, the present disclosure proposes the following two alternative post-processing procedures to be employed by the post-processing unit 236 of the receiver 200: bit flipping and syndrome decoding. These post-processing procedures will now be described in more detail.

Figure 12:
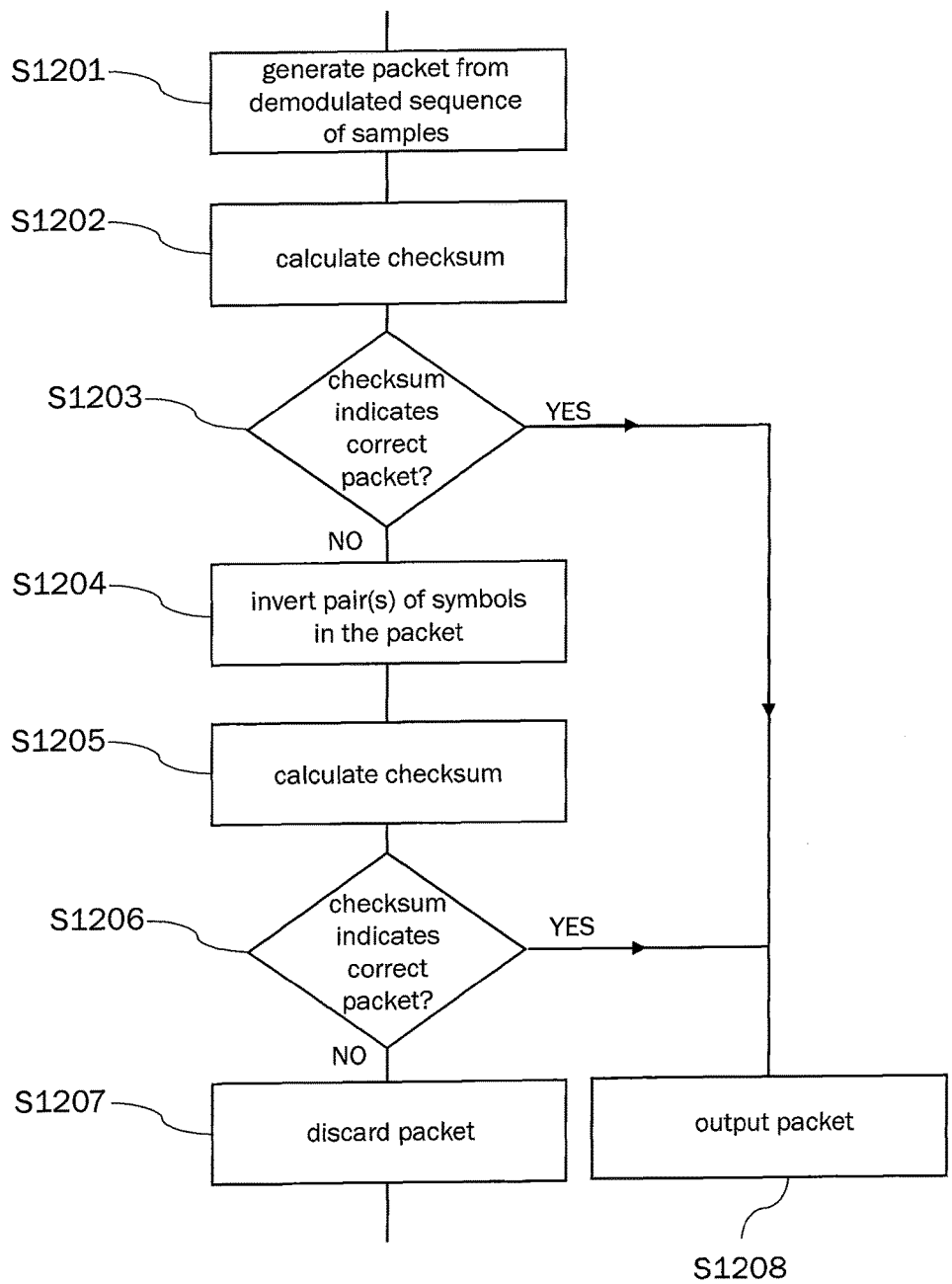
FIG. 12 is a flow chart for illustrating a process flow for post-processing of a demodulated signal according to an embodiment of the disclosure.

First, the bit flipping procedure will be described. When the CRC indicates that a decoded packet is wrong, it is assumed that only one couple of bits is wrong. Thus, by inverting (reverting) a couple (pair) of bits in the packet that has not been decoded correctly, a correct packet can be obtained. Here, inverting indicates that each bit of the pair is switched from +1 to −1 or from −1 to +1 (or equivalently from 1 to 0 or from 0 to 1), depending on the initial state of the respective bit. A more detailed account of the bit flipping procedure is now given with reference to the flow chart of FIG. 12.

At step S1201, a packet of interest is generated from the decoded sequence of samples received from the detection unit 235. At step S1202, the CRC is performed and a checksum of the packet of interest is calculated. If the calculated CRC checksum at step S1203 indicates that the packet has been decoded (detected) correctly, the packet is output at step S1208 as a correctly decoded (detected) packet. Otherwise, the flow proceeds to step S1204, at which one or more pairs of symbols in the packet are inverted. A pair of symbols (bits) corresponds to two symbols that are separated by a single further symbol. After inverting the pair of symbols, at step S1205 the CRC is performed again and the checksum of the packet including the inverted pair of symbols is calculated. If it is found at step S1206 that the calculated CRC checksum now indicates a correctly decoded packet, the flow proceeds to step S1208, at which the packet including the inverted pair of symbols is output as a correctly decoded packet. Otherwise, the respective packet is discarded at step S1207. Alternatively, further post-processing techniques, such as on-ground processing described below may be applied to this packet instead of discarding it.

In a modification, having at hand the likelihood of each decoded symbol to be identical to the corresponding original (i.e., transmitted) symbol that is provided by the SISO algorithm, it is searched for the pair of bits with the lowest reliability (i.e., the lowest likelihood of being identical to the respective original symbols), and the respective pair is inverted at step S1204.

Figure 13:
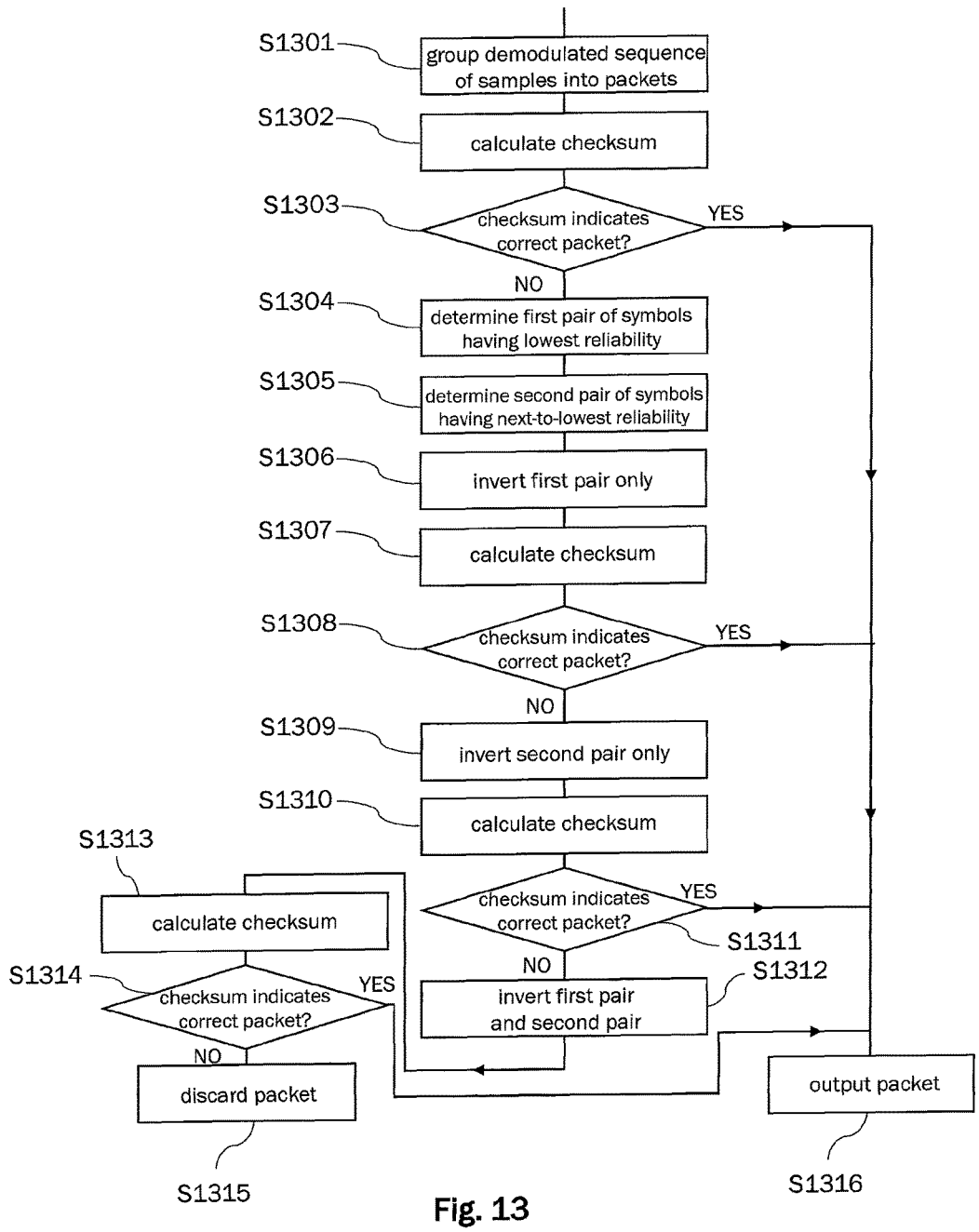
FIG. 13 is a flow chart for illustrating a process flow for post-processing of the demodulated signal according to another embodiment of the disclosure.

In a further modification, the bit flipping operation may be performed on the two least reliable couples, or until a valid codeword (i.e., a correctly decoded packet) is found. This case is illustrated by the flow chart of FIG. 13.

At step S1301, a packet of interest is generated from the decoded sequence of samples received from the detection unit 235. At step S1302, the CRC is performed and a checksum of the packet of interest is calculated. If the calculated CRC checksum at step S1303 indicates that the packet has been decoded (detected) correctly, the packet is output at step S1316 as a correctly decoded (detected) packet. Otherwise, the flow proceeds to step S1304, at which a first pair of symbols having the lowest reliability (i.e., having the lowest likelihood of being identical to the original pair of symbols) is determined. At step S1305, a second pair of symbols having the next-to-lowest reliability (i.e., having the next-to-lowest likelihood of being identical to the original pair of symbols) is determined.

Then, at step S1306, the first pair is inverted, while the second pair is left untouched. After inverting the first pair of symbols, at step S1307 the CRC is performed again and the checksum of the packet including the inverted first pair of symbols is calculated. If it is found at step S1308 that the calculated CRC checksum now indicates a correctly decoded packet, the flow proceeds to step S1316, at which the packet including the inverted first pair of symbols is output as a correctly decoded packet. Otherwise, the flow proceeds to step S1309, at which the first pair is left in its initial state and the second pair is inverted. After inverting the second pair of symbols, at step S1310 the CRC is performed again and the checksum of the packet including the inverted second pair of symbols is calculated. If it is found at step S1311 that the calculated CRC checksum now indicates a correctly decoded packet, the flow proceeds to step S1316, at which the packet including the inverted second pair of symbols is output as a correctly decoded packet. Otherwise, the flow proceeds to step S1312, at which both the first pair and the second pair are inverted (with respect to their respective initial states). After inverting the first and second pairs of symbols, at step S1313 the CRC is performed again and the checksum of the packet including the inverted first and second pairs of symbols is calculated. If it is found at step S1314 that the calculated CRC checksum now indicates a correctly decoded packet, the flow proceeds to step S1316, at which the packet including the inverted first and second pairs of symbols is output as a correctly decoded packet. Otherwise, the flow proceeds to step S1315, at which the respective packet is discarded. Alternatively, further post-processing techniques, such as on-ground processing described below may be applied to this packet instead of discarding it.

In the above, it is understood that the steps of inverting the first pair of symbols only, inverting the second pair of symbols only and inverting both the first and second pairs of symbols may be interchanged, i.e., these steps may be performed in any order.

Figure 14:
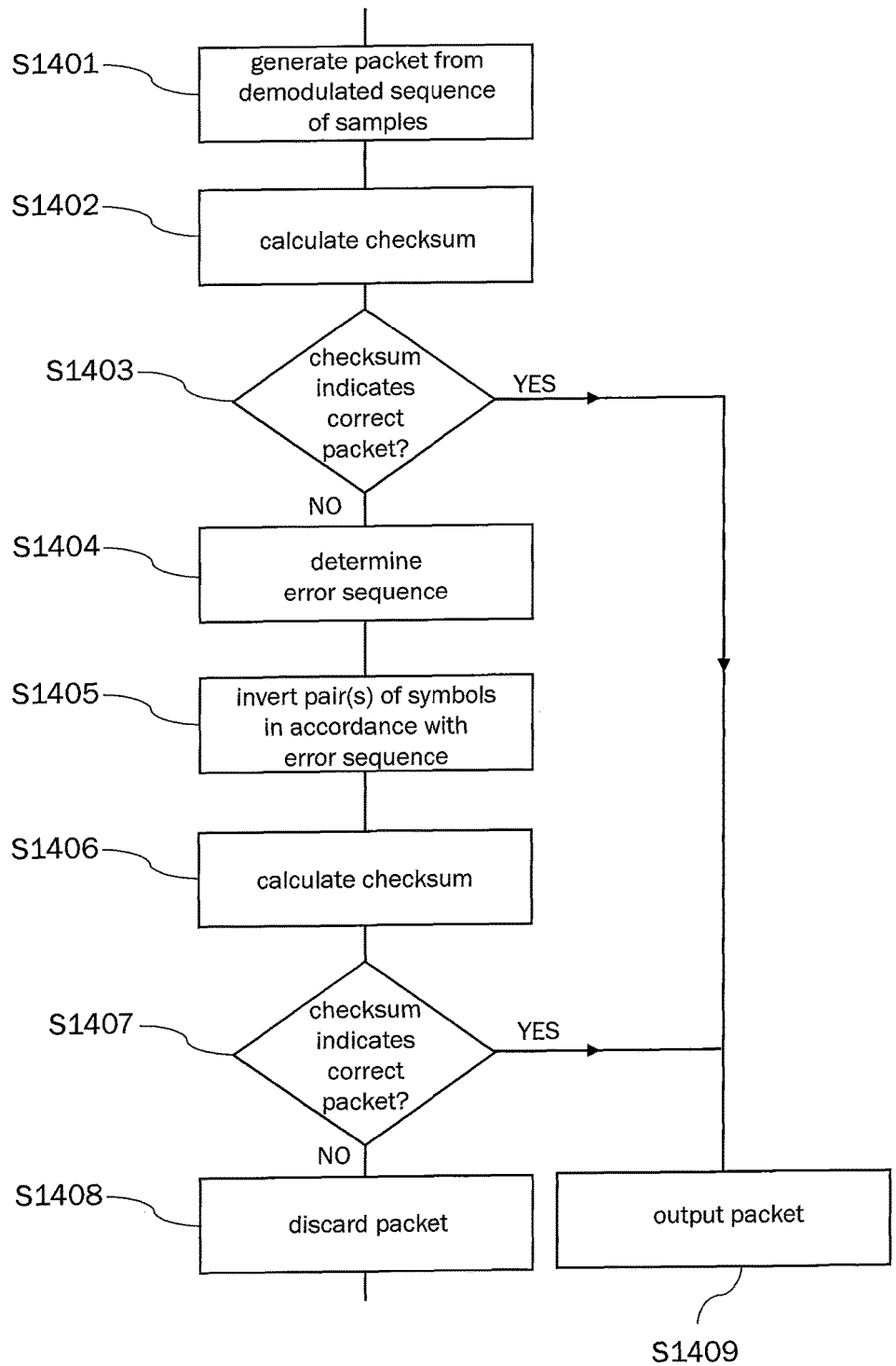
FIG. 14 is a flow chart for illustrating a process flow for post-processing of the demodulated signal according to another embodiment of the disclosure.

Next, the syndrome decoding procedure will be described. The syndrome of any valid codeword (packet) is always equal to a constant value (it is not zero since the CRC foreseen by the AIS standard is not a linear code due to the particular employed initialization), and the syndrome of an invalid codeword depends only on the error sequence, and is independent of the transmitted sequence. For the purposes of the present disclosure, it can be said that the syndrome corresponds to the CRC checksum of the received sequence. In order to apply this kind of post-processing, all error patterns containing one and two couples of wrong bits are tested beforehand and the corresponding syndromes are saved to a pre-stored table which indicates a relationship between checksum values (syndromes) and error sequences (error patterns). When receiving a decoded sequence of samples from the detection unit 235, the following steps illustrated in the flow chart of FIG. 14 are performed.

At step S1401, a packet of interest is generated from the decoded sequence of samples received from the detection unit 235. At step S1402, the CRC (i.e., checksum) is computed for the packet of interest. Here, the CRC checksum corresponds to the syndrome. If it is found at step S1403 that the computed syndrome equals the syndrome of a correct codeword (packet), the packet is declared correct and output as a correctly decoded packet at step S1409. Otherwise, an error sequence (error pattern) is determined by searching for the computed syndrome among those corresponding to the saved error patterns in the pre-stored table, starting from those derived from a single incorrect pair of symbols. In other words, the error sequence is determined on the basis of the checksum value and the pre-stored table indicating a relationship between checksum values and error sequences. If a correspondence is found, at step S1405 the respective error sequence is extracted from the table and the packet is corrected by inverting the respective pair(s) located at positions in the packet indicated by the error sequence. If no correspondence is found, the packet is declared incorrect and is discarded.

After inverting the pair(s) of symbols indicated by the error sequence, at step S1406 the CRC is performed again and the checksum of the packet including the inverted pair(s) of symbols is calculated. If it is found at step S1407 that the calculated CRC checksum now indicates a correctly decoded packet, the flow proceeds to step S1409, at which the packet including the inverted pair(s) of symbols is output as a correctly decoded packet. Otherwise, the respective packet is discarded at step S1408. Alternatively, further post-processing techniques, such as on-ground processing described below may be applied to this packet instead of discarding it.

To further improve the reliability of syndrome decoding, when searching for errors corresponding to two pairs of wrong bits, only those pairs of symbols whose LLRs do not exceed a fixed threshold may be corrected.

It has been verified by the inventors that the second post-processing technique outperforms the first one.

Post Detection Synchronization

Next, the post-detection synchronization unit and its operation will be described. When a packet is correctly decoded (detected), it can be re-modulated and subtracted from the received signal in order to cancel interference by this packet and to try to decode (detect) other packets. However, for this purpose the corresponding (time-invariant) amplitude and (time-varying) channel phase, which are not required for detection, must be estimated. In addition, a refined frequency estimate must be also computed since the frequency uncertainty after the pre-detection synchronization stage is larger than acceptable for a reliable interference cancellation. As the inventors have found, one of the most critical tasks in this respect is represented by the frequency estimation. In fact, in this case a very large accuracy is required. In order to have a limited performance loss with respect to the case of perfect cancellation, the residual frequency error must be lower than $10^{-4}/T$, thus much lower than the frequency error of $10^{-2}/T \div 1.5 \cdot 10^{-2}/T$ that is tolerated by the detection algorithms described above.

Although data-aided (DA) algorithms based on the whole packet are adopted in the prior art receiver disclosed in EP 2 315 366 A1 for frequency, (time-invariant) phase and amplitude estimation, a non-negligible performance loss with respect to perfect cancellation is experienced. In order to improve the performance compared to that of the prior art receiver, the present disclosure proposes the modifications set out below.

First of all, post-detection synchronization is performed based on the oversampled received signal (i.e., the sequence of samples generated therefrom) instead of on the matched filter output. The advantage is that, contrarily to what happens at the output of the matched filter 233, 234, noise is white and inter-symbol interference (ISI) is removed. In other words, it is avoided that ISI and the colored noise degrade the performance. Therefore, an oversampled version of the detected packet is reconstructed, which is also required for performing cancellation, with time shift provided by the pre-detection stage and arbitrary amplitude and phase. This can be achieved through the discrete-time modulator (signal reconstruction unit) 238 and the quadratic interpolator 240. Here, it is not necessary to employ the frequency estimate obtained in the pre-detection stage, since the post-detection frequency estimator (frequency estimator) 237 that we will now be described has a sufficiently large estimation range.

Let $\{\hat{s}_{m_1+m}\}$ denote the samples of the reconstructed packet. Frequency estimation is then performed on samples $z_{m_1+m} = r_{m_1+m} \hat{s}^*_{m_1+m}$ by using the DA Mengali-Morelli algorithm. The use of this algorithm, which has the same performance as the algorithm (Luise-Reggiannini algorithm) proposed in M. Luise, R. Reggiannini, Carrier frequency recovery in all-digital modems for burst-mode transmissions, IEEE Trans. Commun., vol. 43, pp. 1169-1178, March 1995 and employed in the prior art receiver allows also to remove the main limitation of the Luise-Reggiannini algorithm. In fact, the Luise-Reggiannini algorithm has an estimation range which depends on the number of symbol intervals observed by the estimator—the larger this number the more limited the estimation range. Considering that the initial frequency uncertainty (after the pre-detection stage) is $\pm 1.5 \cdot 10^{-2}/T$, the prior art estimator can work by using a very limited number of symbol intervals, thus providing a very limited estimation accuracy.

To address this problem, it is suggested in the prior art to perform frequency synchronization in two steps by using a frequency estimator working on a limited number of symbols in the first step and a second estimator (still based on the Luise-Reggiannini algorithm) working on a larger number of symbols to increase the accuracy. Since the DA Mengali-Morelli algorithm has an estimation range larger than $\pm 0.2/T$ independently of the number of observed symbol intervals, the whole packet can be used to obtain the most accurate estimate. It has been verified by the inventors that for a given number of observed symbols, the DA Mengali-Morelli algorithm has the same performance as the Luise-Reggiannini algorithm for both the AWGN scenario and the interference-limited scenario. In addition, employing the DA Mengali-Morelli algorithm allows reaching the modified Cramer-Rao lower bound (MCRB) in the AWGN scenario, so that there is no room for further improvement of the post-detection frequency synchronization. It has also been verified by the inventors that there is no performance loss in the frequency estimation in the presence of the residual timing error before post-detection frequency synchronization.

Post-detection phase and amplitude estimation in the phase and amplitude estimator 241 can then be performed jointly by using the maximum likelihood (ML) technique. To simplify the notation, $S_{n\eta+m}$ denotes sample $\hat{s}_{n\eta+m}$ after post-detection frequency estimation and compensation. Denoting by $\hat{\theta}$ and $\hat{A}$ the estimates of phase and amplitude, respectively, the time-varying channel phase is updated using a DA first-order phase-locked loop (PLL) with error signal given by $\mathrm{Im}[r_{n\eta+m} S_{n\eta+m}^* e^{-j\theta_{n\eta+m}}]$ whereas the amplitude is estimated as $$\hat{A} = \frac{\left|\sum_{n=0}^{N-1}\sum_{m=0}^{\eta-1} r_{n\eta+m} + S_{n\eta+m}^* e^{-j\hat{\theta}_{n\eta+m}}\right|}{N\eta}$$

where N is the number of symbol intervals considered for the estimation. To leave out of consideration the initialization of the PLL, a forward and a backward PLL can be employed. The forward PLL is used to estimate the phase in the second half of a packet, whereas the backward PLL is employed to estimate the phase in the first half of the packet.

Since the complexity is very limited, estimates based on the whole packet are considered. Contrary to the situation in the prior art, there is now no need to use non-coherent post detection integration to perform the amplitude estimation, since post-detection frequency estimation and compensation has already been performed and an algorithm that is robust with respect to uncompensated frequency offsets is not required.

It is has been observed by the inventors that interference cancellation can be improved, thus obtaining a performance improvement, when timing estimation is refined after post-detection frequency estimation and compensation. According to the present disclosure, this task is performed in the quadratic interpolator 240 using the following DA algorithm. The quadratic interpolator 240 performs both the timing estimation and subsequent quadratic interpolation.

First, the following quantities are computed:

$$\gamma_0 = \sum_{n=0}^{N-1}\sum_{m=0}^{\eta-1} r_{n\eta+m} S_{n\eta+m}^* e^{-j\hat{\theta}_{n\eta+m}}$$

$$\gamma_1 = \sum_{n=0}^{N-1}\sum_{m=0}^{\eta-1} r_{n\eta+m} S_{n\eta+m+1}^* e^{-j\hat{\theta}_{n\eta+m+1}}$$

$$\gamma_{-1} = \sum_{n=0}^{N-1}\sum_{m=0}^{\eta-1} r_{n\eta+m} S_{n\eta+m-1}^* e^{-j\hat{\theta}_{n\eta+m-1}}$$

The refined timing estimate is computed in closed form as $$\tau = \frac{\eta}{T} \frac{\mathrm{Re}[\gamma_0^*(\gamma_1 - \gamma_{-1})/2]}{\frac{|\gamma_1 - \gamma_{-1}|^2}{4} + \mathrm{Re}[\gamma_0^*(\gamma_1 + y_{-1} - 2\gamma_0)]}.$$

The above evaluation should be performed if this timing refinement and the following quadratic interpolation have a complexity which deserves to be spent considering the resulting performance improvement. As can be seen from FIG. 2, the post-detection estimation must be performed using the samples before the limiter 231.

Finally, it is mentioned that in the AIS standard, a few symbols of ramp-up and ramp-down are foreseen at the beginning and at the end of a packet. This fact must be taken into account during the cancellation, i.e., the reconstructed signal must have appropriate ramp-up and ramp-down intervals. From the analysis of real received AIS packets, the power profile corresponding to the ramp-up and ramp-down sections can be determined. Hence, it is possible to estimate the parameters of the power profile and to reconstruct the waveform by combining these estimated profiles with the reconstructed packet that has been reconstructed on the basis of the detected symbols.

Figure 15:
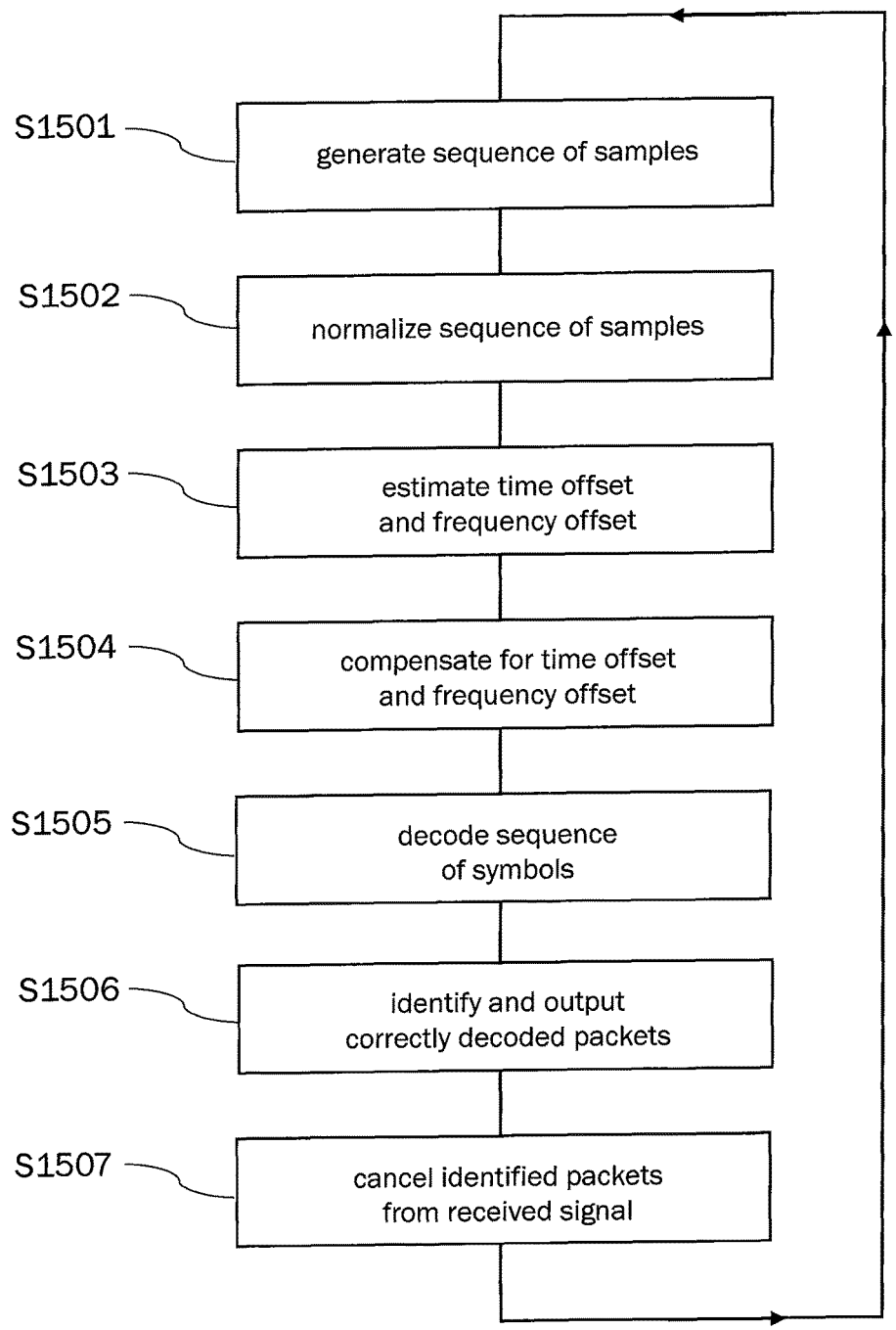
FIG. 15 is a flow chart illustrating a process flow for performing interference cancellation in the received signal according to an embodiment of the disclosure.

The flow chart of FIG. 15 illustrates the operation of the receiver including post-detection synchronization and interference cancellation. Steps S1501 to S1505 correspond to steps S301 to S305 illustrated in FIG. 3, respectively. At step S1506, correctly decoded (detected) packets are identified and output from the receiver. At step 1507, the identified correctly decoded packets are canceled from the sequence of samples by the subtractor 243 before input to the limiter 231 (cf., FIG. 2), in the manner described above. Then, the flow proceeds to step S1501 to perform demodulation of the sequence of samples from which already decoded packets have been cancelled. Subsequently, it may be attempted to decode further packets the decoding of which had not been possible before because of interfering packets. Steps S1501 to 1507 may be repeated as often as necessary to decode all packets, or until a predetermined count for repeating these steps has been reached. It is understood that before performing step S1506, the method may involve further steps relating to the post-processing described above, such as bit flipping or syndrome decoding.

Frame Synchronization

Frame synchronization is performed by computing the CRC checksum for the 128 possible positions of the start of a message. When the right position is found, the CRC is verified, the search is stopped and the successfully decoded message is passed on to the message parser block 204, which has the functions of discarding duplicated messages and passing the successfully detected messages to the signal reconstruction block of each zonal demodulator. In order to lower the probability of false alarms down to an acceptable value and to reduce the complexity, a preliminary start flag and end flag verification is also performed. This procedure does not change in the presence of bit stuffing. In fact, in the AIS standard, it is foreseen that if five consecutive 1's are found in the bit stream to be transmitted, a 0 should be inserted after the five consecutive 1's. As a consequence, at the receiver, when five consecutive 1's are found followed by a 0, the burst length must be increased by one and the initial bit of the CRC field must be translated accordingly.

Finally, it is pointed out that the false alarm probability of the above frame synchronization procedure is independent of the adopted detector. In fact, the false alarm probability in the context of the present application corresponds to the probability that a sequence of randomly generated bits satisfies the CRC and the start flag and end flag verification.

Receiver Performance

Figure 17:
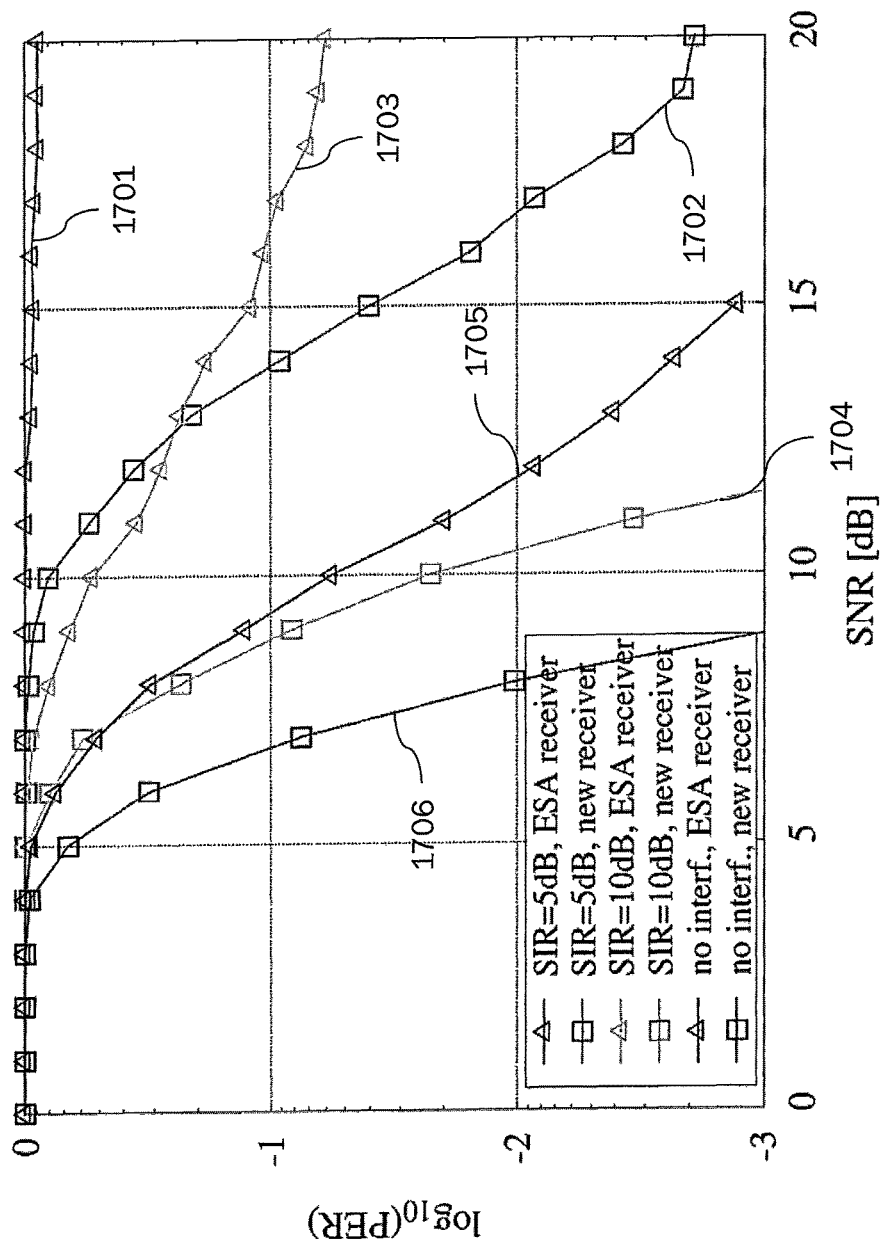
FIG. 17 is a graph illustrating the performance of the present application compared to the prior art.

In FIG. 17, a performance comparison between the prior art receiver disclosed in EP 2 315 366 A1 and the receiver disclosed herein is shown for a single interferer with different values of signal-to-interference power ratio (SIR). Both the useful signal and the interferer have a random normalized Doppler frequency uniformly distributed in the interval [0,0.22], and the receiver disclosed herein employs the fourth timing and frequency estimation algorithm and the second post-processing technique (syndrome decoding). In the figure, the horizontal axis indicates the signal-to-noise ratio (SNR) in units of dB, and the vertical axis indicates the common logarithm of the packet error rate (PER). Graphs 1701, 1703, 1705 indicate the performance of the prior art receiver for SIRs of 5 dB, 10 dB and in the absence of interference, respectively. Graphs 1702, 1704, 1706 indicate the performance of the receiver disclosed herein for SIRs of 5 dB, 10 dB and in the absence of interference, respectively. As can be seen from a comparison of corresponding graphs, the presently-disclosed receiver excels in performance (lower PER) for all values of SIR.

On-Ground Processing

The whole process of conveying information from one point to another reduces to the ability of the receiver to extract the data sent by the transmitter. In digital communications, the existence of a-priori information about the incoming data can assist its extraction, hence improving the receiver performance. Whether or not such a-priori information exists is system dependent. In the AIS, such information exists to a certain degree, and the present disclosure further proposes a mechanism for exploiting availability of a-priori information, if required. This mechanism may be employed to the fullest advantage on-ground where the required a-priori information and computational power are available, but is not limited to such an implementation.

Unlike prior art receivers that dismiss (discard) packets that could not be decoded, in the present disclosure their decoding is re-attempted, but this time using the available a-priori information. This way, computational resources are saved when not needed and spared for those cases in which the SIR is low enough to make the unassisted decoding process fail. Thus, whenever the receiver cannot decode a packet in a first (data unassisted) attempt it will follow the procedure described below in order to retrieve the available a-priori information for a second (this time data assisted) attempt. A packet is discarded only when also the latter attempt fails.

Figure 16:
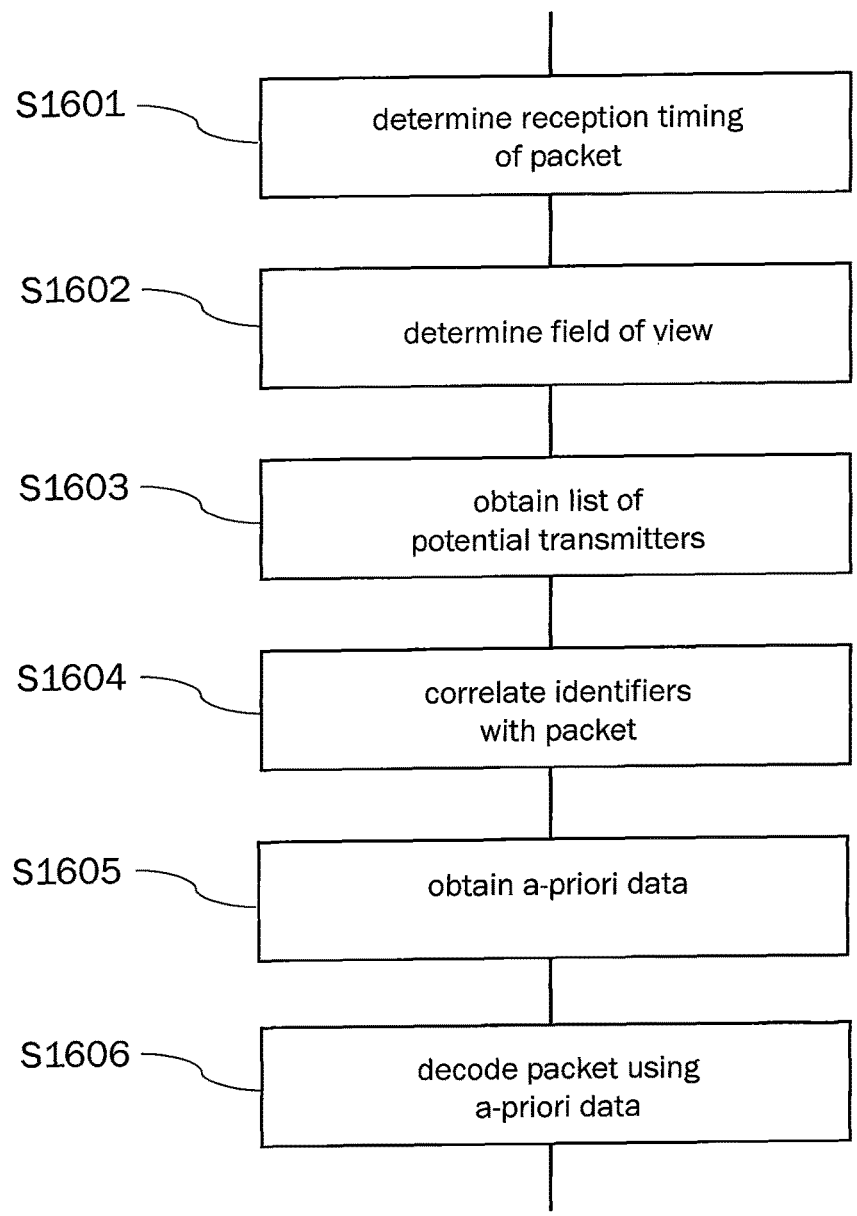
FIG. 16 is a flow chart illustrating a process flow for data-aided decoding of a received packet according to an embodiment of the disclosure.

A process flow of a procedure for data assisted decoding is illustrated in FIG. 16. While the below description makes exemplary reference to an AIS receiver aboard a satellite, the disclosure shall not be limited to receivers aboard satellites, and shall extend to alternative locations for installation of the receiver. Moreover, in the following description, it will be referred to on-ground processing, in which case a packet that could not be decoded is transmitted to a remote (on-ground) processing site. However, the present disclosure shall not be limited to this case, and shall in particular comprise the case that the packet is not transmitted to a remote processing site, but is processed in the receiver in accordance with the below procedure. Although in this case the term "data aided processing" would be more appropriate, the below description nevertheless only refers to on-ground processing, for reasons of conciseness.

Whenever a packet arrives at the receiver, it is tried to decode it. In case of failure to decode the packet, at step S1601 a reception timing of the packet at which the packet has been received is determined by looking up the time at which, e.g., the satellite has received the corresponding data.

At step S1602, the determined reception timing is used along with the satellite's ephemeris to estimate the satellite's field of view at the reception timing. If the receiver is installed on a naval vessel or any other sea- or earthbound object, the location of the respective object is taken into account instead of the satellite's ephemeris. If the receiver is installed at a fixed position, steps S1601 and S1602 may be omitted, and the receiver's fixed field of view may be looked up, e.g., from a database.

At step S1603, a list of potential transmitters of the received packet is obtained by referring to a database containing the latest known position of all naval vessels (transmitting objects) and identifying those that could have been in sight of the satellite at the reception timing. These naval vessels form a set of potential transmitters.

At step S1604, the MMSI of each naval vessel that has been in sight of the satellite is correlated with the received packet, or with at least the MMSI field of the received packet.

At step S1605, the available a-priori data (previously obtained data) is obtained by retrieving the available a-priori data of those MMSIs for which the correlation obtained at step S1604 is above a predetermined threshold. If the correlation is not above the threshold for any of the MMSIs of the potential transmitters, the packet is discarded.

At step S1606, the obtained a-priori data (previously obtained data) is used to aid demodulation (decoding) of the received packet for each MMSI for which the correlation has been above the predetermined threshold. Whenever the decoder succeeds in decoding, the process stops and the information of the decoded packet is extracted. Otherwise the received packet is discarded.

As indicated above, steps S1601 to S1606 may be performed either at a remote (on-ground) processing site, or in the receiver itself, wherein in the former case the procedure further comprises a transmission step of transmitting the received packet to the processing site.

The above technique uses a-priori known information to assist the decoding process when the receiver fails to recover the new position of a naval vessel (i.e., of the specific MMSI). That information consists of the 70 bits corresponding to: a training sequence (24 bits), a start flag (8 bits), a user-ID (30 bits) and an end flag (8 bits). On top of these, the particular nature of the AIS allows to use some additional bits coming from the latitude and longitude fields as a-priori information, although not in a straightforward manner. Their number and value (along with the corresponding confidence level) can be determined based on the latest reported position, speed and heading of the naval vessel.

The position information is by nature highly correlated. In other words, the coordinates of two points that lie close together are expected to be similar. Given the small distance traveled by a naval vessel within the time span between two consecutive AIS reports, the receiver can assume a value for the latitude/longitude (lat/lon) main significant bits with certain confidence level and use that information as a-priori information to assist the decoding process.

The AIS is a memory-less system where all the information about the position of a naval vessel is contained in the latest successful report. As soon as this report is received, the location of the naval vessel is perfectly determined and corresponds to a point with virtually no uncertainty. As time passes, this point transforms into a growing region representing the position uncertainty due to the movement of the naval vessel. This area is defined as the Search and Rescue (SAR) region in which the probability of finding the naval vessel is 100%.

However, a naval vessel not only reports its position, but also its speed and heading, hence the probability of finding the naval vessel within the SAR region is not uniform. Instead, the naval vessel is expected to be at certain point according to a certain navigation plan or certain navigation criteria, although its actual position is still unknown. The expected position on its own is meaningless unless it comes along with a probability density function (PDF). The PDF determines the confidence level of the prediction.

The SAR region and the PDF in the SAR region will now be explained in more detail by way of an example. Let t be the elapsed time since the latest report from a given naval vessel. With the latest report, the naval vessel had informed the AIS to be at certain position $p_0$ with heading $h_0$ at speed $v_0$. For the sake of simplicity is assumed that the SAR region is a circle centered in $p_0$ with radius $R_{SAR}$ (over the earth's surface). The radius may be established according to certain criteria, for example, $R_{SAR}=v_{max}t$ where $v_{max}$ is the naval vessel's maximum speed, but other variables such as sea currents may be also accounted for. Assuming that the naval vessel follows an orthodromic route passing through $p_0$ with heading $h_0$ and that the distance traveled in t is presumably $d=v_0 t$, then the expected position p(t) is easily determined. As indicated above, the expected position p(t) must come along with an associated PDF. A Gaussian function as indicated in (eq. 3.13) which is centered in p(t) and varies with the geographical distance (i.e., distance over the Earth's surface) r(p) to this point seems a reasonable choice. The variance of the Gaussian function is chosen so that $p_0$ lies in the 3σ circle (3σ=d).

If, for instance, a naval vessel is considered that has reported to be at 25° N 45° W, heading 45° at a speed of 25 kn four hours ago (example 1), its current expected position is 26.1732563015498° N 43.6878131578038° W. The encoded fields in this case are given by 0001110111111001111110010001 and 11100111000000000011010110001, respectively.

$$f_g(p) = K_g e^{-\frac{r(p)^2}{2\sigma^2}} \text{ with } K_g = \frac{1}{\int\int_{SAR} e^{-\frac{r(p)^2}{2\sigma^2}}} \qquad \text{(eq. 3.13)}$$

The question now is how confident one can be in the correctness of the values of these bits. Using the PDF it is fairly simple to make a good estimation for the most significant bits, wherein it has to be noted that although the numbers are easily calculable, the results are case dependent.

If, for instance, a naval vessel is considered that has reported to be at 26° N 92° W (Gulf of Mexico), heading 135° at a speed of 25 kn two hours ago (example 2), the number of bits with high certainty is bigger since the elapsed time is shorter and therefore the uncertainty is smaller. A similar result is expected if the naval vessel is traveling in a small bounded region such as the Black Sea.

More realistic modeling is possible if traffic information is also taken into account. This may be done through a weighted sum of terms. If, for instance, a naval vessel is considered that has reported its position at the Bay of Bengal 6.25° N 90° E, heading 90° at a speed of 25 kn two hours ago (example 3), taking into account the traffic patterns in that area, the PDF given in (eq. 3.14) is obtained where $f_g(p)$ is the Gaussian function, $f_t(p)$ is a function representing the traffic, $K_t$ is a weighting constant and $K_N$ is a normalization constant. When including the traffic, it makes sense to re-compute the expected position to be the expected position of the PDF rather than the center of the Gaussian function.

$$f_{pdf}(p) = K_N(1 + K_t f_t(p))f_g(p), \qquad \text{(eq. 3.14)}$$
$$\text{with } K_N = \frac{1}{\int\int_{SAR}(1 + K_t f_t(p))f_g(p)}.$$

For the particular case of the naval vessel in the Bay of Bengal, and for typical traffic patterns in that area, the inclusion of the traffic helps to narrow down the area where there is a high probability of finding the naval vessel, hence the results are better. However it may also happen that the inclusion of the traffic broadens this area and the results are worsened. Thus, it is eventually decisive how faithful to reality the used PDF is.

Figure 18A:
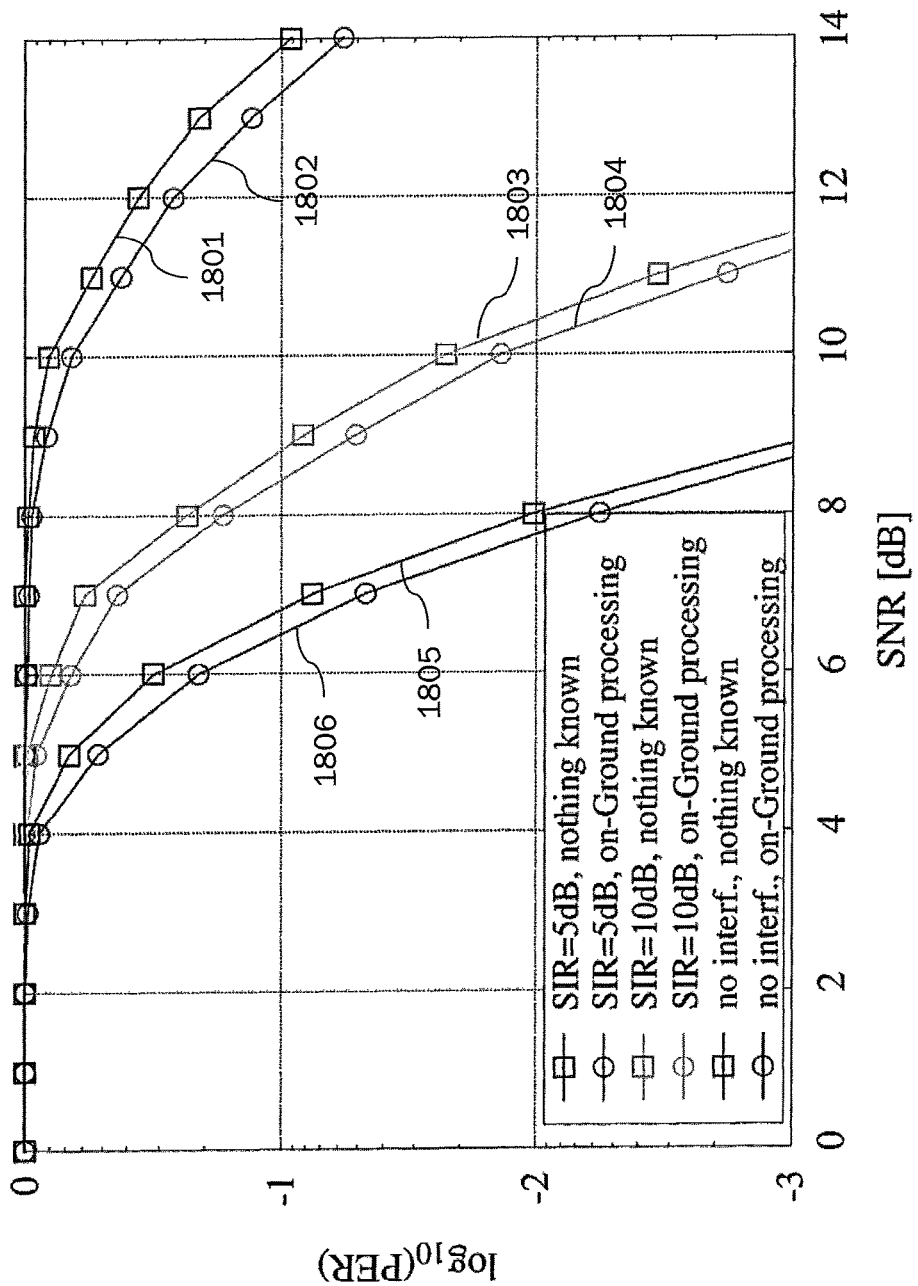
FIG. 18A, 18B are graphs illustrating the performance of the method with and without data-aided decoding.
Figure 18B:
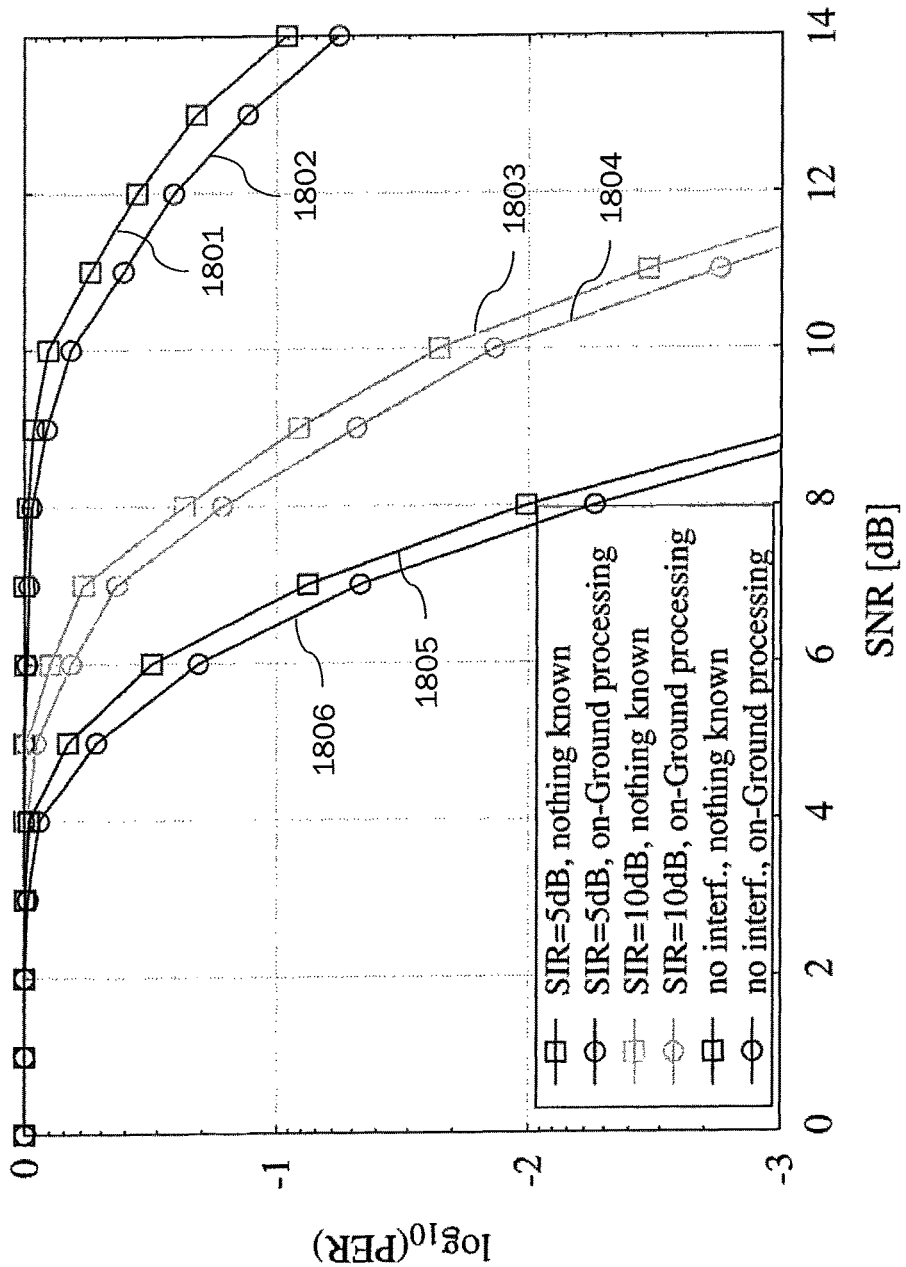

Lastly, the performance gain obtainable from the adoption of the described on-ground processing is illustrated in FIGS. 18A and 18B. To perform realistic simulations, however, it is necessary to take into account the bit permutation and the Non Return to Zero (NRZI) encoding foreseen by the AIS standard. In particular, the 168 data bits are split into octets, and then, the octets are left in the original order, but with the bit order reversed inside each single octet. After this operation, the whole packet is subjected to NRZI encoding, in which each transmitted symbol results from $$s_i = c_i + c_{i-1} + 1, \qquad \text{(eq. 4.1)}$$

where $c_i$ and $c_{i-1}$ are two consecutive bits of the packet and the sum is intended to be modulo 2. From (eq. 4.1) it is clear that the symbol $s_i$ is incorrect if and only if a single bit error is present on $c_i$ or on $c_{i-1}$. Thus, the error probability of $s_i$ can be expressed as $$P\{s_i \neq \bar{s}_i\} = P\{\bar{c}_i\}P\{c_i\}P\{c_{i-1}=\bar{c}_{i-1}\} + P\{c_i \neq \bar{c}_i\}P\{c_{i-1} \neq \bar{c}_{i-1}\}, \qquad \text{(eq. 4.2)}$$

where $\bar{s}_i$, $\bar{c}_i$, $\bar{c}_{i-1}$ represent the correctly transmitted values.

FIG. 18A illustrates the performance of the method disclosed herein with and without on ground processing for the case of the naval vessel of example 1, i.e., a naval vessel in the open sea, for different values of SIR. FIG. 18B illustrates the performance of the method with and without on ground processing for the case of the naval vessel of example 2, i.e., a naval vessel in Gulf of Mexico, for different values of SIR. Both the useful signal and the interferer have a random normalized Doppler frequency uniformly distributed in the interval [0,0.22]. As in FIG. 17, the horizontal axis indicates the signal-to-noise ratio (SNR) in units of dB, and the vertical axis indicates the common logarithm of the packet error rate (PER). Graphs 1801, 1811 indicate the performance of the method without on-ground processing for a SIR of 5 dB for example 1 and example 2, respectively, and graphs 1802, 1812 indicate the performance of the method with on-ground processing for a SIR of 5 dB for example 1 and example 2, respectively. Graphs 1803, 1813 indicate the performance of the method without on-ground processing for a SIR of 10 dB for example 1 and example 2, respectively, and graphs 1804, 1814 indicate the performance of the method with on-ground processing for a SIR of 10 dB for example 1 and example 2, respectively. Graphs 1805, 1815 indicate the performance of the method without on-ground processing in the absence of interference for example 1 and example 2, respectively, and graphs 1806, 1816 indicate the performance of the method with on-ground processing in the absence of interference for example 1 and example 2, respectively. As can be seen from a comparison of corresponding graphs, the presently-disclosed receiver with on-ground processing excels in performance (lower PER) for all values of SIR and for both example 1 and example 2.

Features, components and specific details of the structures of the above-described embodiments may be exchanged or combined to form further embodiments optimized for the respective application. As far as those modifications are readily apparent for an expert skilled in the art, they shall be disclosed implicitly by the above description without specifying explicitly every possible combination, for the sake of conciseness of the present description.

The invention claimed is:

1. A method for demodulating a received signal relating to a sequence of transmitted symbols that have been modulated by continuous phase modulation, the method comprising the steps of:
  A) normalizing samples of a sequence of samples generated from the received signal, to obtain a normalized sequence of samples, wherein an amplitude of each sample of the normalized sequence of samples has an absolute value equal to unity;
  B) estimating, on the basis of the normalized sequence of samples, a time offset and a frequency offset of the received signal and using the estimated time offset and the estimated frequency offset for compensating the normalized sequence of samples for the time and frequency offsets to obtain a compensated sequence of samples; and
  C) determining a sequence of symbols corresponding to the transmitted sequence of symbols on the basis of the compensated sequence of samples,
  wherein estimating the time offset and the frequency offset involves:
    filtering the normalized sequence of samples using a low-pass filter to obtain a filtered sequence of samples;
    determining the estimate of the time offset on the basis of a first result obtained by auto-correlating the filtered sequence of samples;
    determining the estimate of the frequency offset on the basis of a second result obtained by auto-correlating the filtered sequence of samples or a first sequence of samples derived from the normalized sequence of samples;
    interpolating the normalized sequence of samples or a second sequence of samples derived from the normalized sequence of samples on the basis of the estimate of the time offset; and
    compensating the normalized sequence of samples or a third sequence of samples derived from the normalized sequence of samples for the frequency offset using the estimate of the frequency offset, to obtain the compensated sequence of samples.

2. The method according to claim 1, wherein the estimate of the time offset and the estimate of the frequency offset are determined using a feed-forward algorithm that involves performing an auto-correlation of a sequence of samples input to the algorithm.

3. The method according to claim 1, wherein in the step of determining the sequence of symbols, each of the determined symbols is a symbol that has a highest probability of being identical to the corresponding transmitted symbol.

4. The method according to claim 1, wherein the sequence of samples has a first ratio of samples per transmitted symbol; and
  the method further comprises:
    down-sampling the compensated sequence of samples to obtain a down-sampled sequence of samples, the down-sampled sequence of samples having a second ratio of samples per transmitted symbol lower than the first ratio of samples; and
    determining the sequence of symbols corresponding to the transmitted sequence of symbols on the basis of the down-sampled sequence of samples.

5. The method according to claim 4, wherein the first ratio is 3 or more, and the second ratio is 1.

6. The method according to claim 1, further comprising:
  D) identifying packets of symbols that have been decoded correctly;
  E) cancelling said correctly decoded packets from the sequence of samples by subtracting, from the sequence of samples, a reconstructed signal that has been reconstructed from said correctly decoded packets to obtain an interference-cancelled sequence of samples; and
  repeating the steps of the method according to claim 1 for the interference-cancelled sequence of symbols.

7. The method according to claim 1, further comprising, if decoding a packet of symbols has failed,
  determining a reception timing at which the respective packet of symbols has been received;
  determining the field of view from which signals could have been received at the reception timing;
  obtaining a list of potential transmitters that have been in the field of view at the reception timing; and
  correlating, for each of the potential transmitters, an identifier of the respective potential transmitter of the packet of symbols for which decoding has failed with said packet to obtain a correlation value;
  obtaining previously obtained data relating to each of the potential transmitters for which the correlation value is above a predetermined threshold; and
  decoding said packet of symbols using the previously obtained data.

8. A method for demodulating a received signal relating to a sequence of transmitted symbols that have been modulated by continuous phase modulation, the method comprising the steps of:
  A) estimating, on the basis of a sequence of samples generated from the received signal, a time offset and a frequency offset of the received signal and using the estimated time offset and the estimated frequency offset for compensating the sequence of samples for the time and frequency offsets, to obtain a compensated sequence of samples;
  B) determining a sequence of symbols corresponding to the transmitted sequence of symbols on the basis of the compensated sequence of samples, wherein each of the determined symbols is a symbol that has a highest probability of being identical to the corresponding transmitted symbol;
  generating a packet from the determined sequence of symbols;
  calculating a checksum for the packet; and
  if the checksum indicates that the packet has not been decoded correctly, inverting a pair of symbols in the packet, wherein the two symbols of the pair of symbols are separated by a further symbol.

9. The method according to claim 8, further comprising, for each determined symbol, determining a probability of the determined symbol being identical to the corresponding transmitted symbol.

10. The method according to claim 8, further comprising:
in the packet that has been judged as not decoded correctly, determining a first pair of symbols having the lowest probability of being identical to the corresponding transmitted symbols; and
inverting the symbols of the determined first pair of symbols.

11. The method according to claim 8, further comprising:
in the packet that has been judged as not decoded correctly, determining a first pair of symbols having the lowest probability of being identical to the corresponding transmitted symbols and a second pair of symbols having the next-to-lowest probability of being identical to the corresponding transmitted symbols; and
inverting, not necessarily in this order, the symbols of the first pair only, the symbols of the second pair only, and the symbols of the first and second pairs simultaneously, until the checksum of the resulting packet indicates that the resulting packet has been decoded correctly.

12. The method according to further comprising:
for the packet that has been judged as not decoded correctly, determining an error sequence on the basis of the checksum and a pre-stored table indicating a relationship between checksum values and error sequences; and
inverting pairs of symbols that are located in the packet at positions indicated by the error sequence.

13. A receiver for demodulating a received signal relating to a sequence of transmitted symbols that have been modulated by continuous phase modulation, the receiver comprising:
normalization means for normalizing samples of a sequence of samples generated from the received signal, to obtain a normalized sequence of samples, wherein an amplitude of each sample of the normalized sequence of samples has an absolute value equal to unity;
estimation means for estimating, on the basis of the normalized sequence of samples, a time offset and a frequency offset of the received signal, and using the estimated time offset and the estimated frequency offset for compensating the normalized sequence of samples for the time and frequency offsets, to obtain a compensated sequence of samples; and
decoding means for determining a sequence of symbols corresponding to the transmitted sequence of symbols on the basis of the compensated sequence of samples, wherein the estimation means is configured to:
filter the normalized sequence of samples using a low-pass filter to obtain a filtered sequence of samples;
determine the estimate of the time offset on the basis of a first result obtained by auto-correlating the filtered sequence of samples;
determine the estimate of the frequency offset on the basis of a second result obtained by auto-correlating the filtered sequence of samples or a first sequence of samples derived from the normalized sequence of samples;
interpolate the normalized sequence of samples or a second sequence of samples derived from the normalized sequence of samples on the basis of the estimate of the time offset; and
compensate the normalized sequence of samples or a third sequence of samples derived from the normalized sequence of samples for the frequency offset using the estimate of the frequency offset to obtain the compensated sequence of samples.

14. The receiver according to claim 13, wherein the decoding means is configured to determine the sequence of symbols such that each of the determined symbols is a symbol that has a highest probability of being identical to the corresponding transmitted symbol.

15. The receiver according to claim 13, wherein the sequence of samples has a first ratio of samples per transmitted symbol;
the receiver further comprises down-sampling means for down-sampling the compensated sequence of samples to obtain a down-sampled sequence of samples, the down-sampled sequence of samples having a second ratio of samples per transmitted symbol lower than the first ratio of samples; and
the decoding means is configured to determine the sequence of symbols corresponding to the transmitted sequence of symbols on the basis of the down-sampled sequence of samples.

16. The receiver according to claim 15, wherein the first ratio is 3 or more, and the second ratio is 1.

17. The receiver according to claim 13, further comprising:
means for identifying packets of symbols which have been correctly decoded; and
cancellation means for cancelling said correctly decoded packets from the sequence of symbols by subtracting, from the sequence of symbols, a reconstructed sequence of symbols that has been reconstructed from said correctly decoded packets, to obtain an interference-cancelled sequence of samples to be used for further demodulation processing.

18. A receiver for demodulating a received signal relating to a sequence of transmitted symbols that have been modulated by continuous phase modulation, the receiver comprising:
estimation means for estimating, on the basis of a sequence of samples generated from the received signal, a time offset and a frequency offset of the received signal, and using the estimated time offset and the estimated frequency offset for compensating the sequence of samples for the time and frequency offsets, to obtain a compensated sequence of samples;
decoding means for determining a sequence of symbols corresponding to the transmitted sequence of symbols from the compensated sequence of samples, wherein each of the determined symbols is a symbol that has a highest probability of being identical to the corresponding transmitted symbol,
packet generating means for generating a packet from the determined sequence of symbols;
checksum calculating means for calculating a checksum for the packet; and
inverting means for inverting, if the checksum indicates that the packet has not been decoded correctly, a pair of symbols in the packet, wherein the two symbols of the pair of symbols are separated by further symbol.

19. The receiver according to claim 18, wherein the decoding means is further configured to determine, for each determined symbol, a probability of the determined symbol being identical to the corresponding transmitted symbol.

20. The receiver according to claim 18, further comprising means for determining a first pair of symbols having the lowest probability of being identical to the corresponding transmitted symbols in the packet that has been judged as not decoded correctly, wherein the inverting means is further configured to invert the symbols of the determined first pair of symbols.

21. The receiver according to claim 18, further comprising means for determining a first pair of symbols having the lowest probability of being identical to the corresponding transmitted symbols and a second pair of symbols having the next-to-lowest probability of being identical to the corresponding transmitted symbols in the packet that has been judged as not decoded correctly, wherein the inverting means is configured to invert, not necessarily in this order, the symbols of the first pair only, the symbols of the second pair only, and the symbols of the first and second pairs simultaneously, until the checksum of the resulting packet indicates that the resulting packet has been decoded correctly.

22. The receiver according to claim 18, further comprising means for determining, for the packet that has been judged as not decoded correctly, an error sequence on the basis of the checksum and a pre-stored table indicating a relationship between checksum values and error sequences, wherein the inverting means is further configured for inverting pairs of symbols that are located in the packet at positions indicated by the error sequence.

\* \* \* \* \*

UNITED STATES PATENT AND TRADEMARK OFFICE
CERTIFICATE OF CORRECTION

PATENT NO. : 10,116,476 B2
APPLICATION NO. : 15/110928
DATED : October 30, 2018
INVENTOR(S) : Giulio Colavolpe et al.

It is certified that error appears in the above-identified patent and that said Letters Patent is hereby corrected as shown below:

On the Title Page

Column 2: Item (56) References Cited:
"WO 2008/053853 A2 4/2009" should read, -- WO 2009/053853 A2 4/2009 --.

Signed and Sealed this
Thirty-first Day of December, 2019

Andrei Iancu
*Director of the United States Patent and Trademark Office*